United States Patent
Hincks et al.

(10) Patent No.: US 10,587,277 B2
(45) Date of Patent: Mar. 10, 2020

(54) GENERATING A CONTROL SEQUENCE FOR QUANTUM CONTROL

(71) Applicant: QUANTUM VALLEY INVESTMENT FUND LP, Waterloo (CA)

(72) Inventors: Ian N. Hincks, Kitchener (CA); Chris E. Granade, Sydney (AU); Troy W. Borneman, Waterloo (CA); David G. Cory, Branchton (CA)

(73) Assignee: Quantum Valley Investment Fund LP, Waterloo (CA)

( * ) Notice: Subject to any disclaimer, the term of this patent is extended or adjusted under 35 U.S.C. 154(b) by 106 days.

(21) Appl. No.: 15/328,951

(22) PCT Filed: Sep. 23, 2015

(86) PCT No.: PCT/CA2015/000500
§ 371 (c)(1),
(2) Date: Jan. 25, 2017

(87) PCT Pub. No.: WO2016/044917
PCT Pub. Date: Mar. 31, 2016

(65) Prior Publication Data
US 2017/0214410 A1    Jul. 27, 2017

Related U.S. Application Data

(60) Provisional application No. 62/054,630, filed on Sep. 24, 2014.

(51) Int. Cl.
*H03L 7/26*    (2006.01)
*G06N 10/00*   (2019.01)
(Continued)

(52) U.S. Cl.
CPC ............... *H03L 7/26* (2013.01); *G05B 17/02* (2013.01); *G06F 13/36* (2013.01);
(Continued)

(58) Field of Classification Search
CPC ...... G06N 99/002; G06N 10/00; G11C 11/44; G06F 13/36; G06F 13/4068; G06F 15/82;
(Continued)

(56) References Cited

U.S. PATENT DOCUMENTS

2006/0248945 A1   11/2006  Bleich
2007/0052416 A1   3/2007   Bottcher et al.
(Continued)

FOREIGN PATENT DOCUMENTS

| EP | 0895092 | 2/1999 |
|----|---------|--------|
| JP | 4040745 | 11/2007 |
| WO | 2014176662 | 11/2014 |

OTHER PUBLICATIONS

EPO, Extended European Search Report dated Apr. 18, 2018, in 15844306.9, 4 pgs.
(Continued)

*Primary Examiner* — Arnold M Kinkead
(74) *Attorney, Agent, or Firm* — Henry Patent Law Firm PLLC

(57) ABSTRACT

In some aspects, a control system interacts with a quantum system. In some instances, the quantum system includes qubits that respond to a control signal generated by the control system, and the control system is configured to generate the control signal in response to an input signal. A control sequence (which may include, for example, a sequence of values for the input signal) can be generated by a computing system based on a target operation to be applied to the qubits. The control sequence can be generated based on the target operation, a quantum system model, a distortion model and possibly other information. The quantum system model represents the quantum system and includes a control parameter representing the control signal. The distortion model represents a nonlinear relationship between (Continued)

(51) Int. Cl.

| | |
|---|---|
| *G05B 17/02* | (2006.01) |
| *G06F 15/82* | (2006.01) |
| *B82Y 15/00* | (2011.01) |
| *G11C 11/44* | (2006.01) |
| *G06F 13/40* | (2006.01) |
| *G06F 13/36* | (2006.01) |

(52) U.S. Cl.
CPC .......... *G06F 13/4068* (2013.01); *G06F 15/82* (2013.01); *G06N 10/00* (2019.01); *G11C 11/44* (2013.01); *B82Y 15/00* (2013.01)

(58) Field of Classification Search
CPC ........... G01R 33/48; H03L 7/26; G05B 17/02; B82Y 15/00
USPC ...................... 324/309, 307; 436/173; 73/105
See application file for complete search history.

(56) References Cited

U.S. PATENT DOCUMENTS

| | | | |
|---|---|---|---|
| 2013/0090884 | A1 | 4/2013 | Glaser et al. |
| 2013/0096698 | A1 † | 4/2013 | Ulyanov |
| 2014/0264285 | A1 † | 9/2014 | Chow et al. |
| 2015/0262073 | A1 † | 9/2015 | Lanting |
| 2015/0358022 | A1 * | 12/2015 | McDermott, III ......................... H03K 19/1958 326/5 |
| 2016/0041536 | A1 † | 2/2016 | Benosman et al. |
| 2017/0214410 | A1 | 7/2017 | Hincks et al. |

OTHER PUBLICATIONS

Granade , et al., "Practical Characterization and Control of Quantum Systems", Seminar at Sandia National Laboratories; Christopher Granade Inst. for Quantum Computing, Jun. 24, 2014, 13 pgs.

Canadian Intellectual Property Office, International Search Report issued in International Application No. PCT/ CA2015/000500 dated Nov. 16, 2015, 3 pgs.

Canadian Intellectual Property Office, International Written Opinion issued in International Application No. PCT/ CA2015/000500 dated Nov. 16, 2015, 4 pgs.

Bachar, Gil , et al., "Nonlinear induction detection of electron spin resonance", Applied Physics Letters 101, 022602, ISSN 0003-6951, 1077-3118, 2012, 5 pgs.

Barbara, Thomas M., et al., "Phase Transients in NMR Probe Circuits", Journal of Magnetic Resonance 93, pp. 497-508, ISSN 0022-2364, 1991, 12 pgs.

Barends, R. , et al., "Superconducting quantum circuits at the surface code threshold for fault tolerance", Nature 508, pp. 500-503, ISSN 0028-0836, 2014, 4 pgs.

Benningshof, O.W.B. , et al., "Superconducting microstrip resonator for pulsed ESR of thin films", Journal of Magnetic Resonance 230, pp. 84-87, ISSN 10907807, 2013, 4 pgs.

Borneman, Troy W., et al., "Application of optimal control to CPMG refocusing pulse design", Journal of Magnetic Resonance in Press, Corrected Proof, pp. 220-233, ISSN 1090-7807, 2010, 14 pgs.

Borneman, Troy W., et al., "Bandwidth-limited control and ringdown suppression in high-Q resonators", Journal of Magnetic Resonance 225, pp. 120-129, ISSN 1090-7807, 2012, 10 pgs.

Borneman, T.W. , et al., "Parallel Information Transfer in a Multinode Quantum Information Processor", Physical Review Letters 108, 140502, 2012, 5 pgs.

Cappellaro, P. , et al., "Entanglement Assisted Metrology", Physical Review Letters 94, 020502, 2005, 4 pgs.

Dahm, T. , et al., "Theory of intermodulation in a superconducting microstrip resonator", Journal of Applied Physics 81, 2002, ISSN 0021-8979, 1996, 9 pgs.

D'Alessandro, Domenico , "Introduction to quantum control and dynamics", CRC press, pp. 81-82, 2007, 8 pgs.

Day, Peter K., et al., "A broadband superconducting detector suitable for use in large arrays", Nature 425, pp. 817-821, ISSN 0028-0836, 2003, 5 pgs.

Egger, D.J. , et al., "Adaptive Hybrid Optimal Quantum Control for Imprecisely Characterized Systems", Physical Review Letters 112, 240503, 2014, 5 pgs.

Fortunato, Evan M., et al., "Design of strongly modulating pulses to implement precise effective Hamiltonians for quantum information processing", The Journal of Chemical Physics 116, pp. 7599-7606, ISSN 0021-9606, 1089-7690, 2002, 9 pgs.

Fowler, Austin G., et al., "High-threshold universal quantum computation on the surface code", Physical Review A 80, 052312, 2009, 14 pgs.

Goerz, Michael H., et al., "Optimal control theory for a unitary operation under dissipative evolution", New Journal of Physics 16, 055012, ISSN 1367-2630, 2014, 29 pgs.

Gottesman, Daniel , "An Introduction to Quantum Error Correction and Fault-Tolerant Quantum Computation", http://arXiv:0904.2557v1 [quant-ph], Apr. 2009, 46 pgs.

Granade, C. E , "Characterization, Verification and Control for Large Quantum Systems", Ph.D. thesis, University of Waterloo, Waterloo, ON, 2014, 259 pgs.

Granade, Christopher , et al., "Practical Characterization and Control of Quantum Systems", Institute for Quantum Computing, Jun. 16, 2014, sections "Abstract"-"Conclusions", retrieved online on Oct. 26, 2015 from http://nbviewer.ipython.org/github/cgranade/cgranade.github.io/blob/master/research/talks/sandia-2014/slides.ipynb, Jun. 16, 2014, 21 pgs.

Grezes, C. , et al., "Multimode Storage and Retrieval of Microwave Fields in a Spin Ensemble", Physical Review X 4, 021049, 2014, 9 pgs.

Gustavsson, Simon , et al., "Improving Quantum Gate Fidelities by Using a Qubit to Measure Microwave Pulse Distortions", Physical Review Letters 110, 040502, 2013, 5 pgs.

Gutirrez, Mauricio , et al., "Approximation of realistic errors by Clifford channels and Pauli measurements", Physical Review A 87, 030302(R), 2013, 5 pgs.

Hocker, David , et al., "Characterization of control noise effects in optimal quantum unitary dynamics", http://arxiv.org/abs/1405.5950v2 [quant-ph], Nov. 2014, 11 pgs.

Hodges, J. S. , et al., "Universal control of nuclear spins via anisotropic hyperfine interactions", Physical Review A 78, 010303(R), 2008, 4 pgs.

Hoult, D. I. , "Fast recovery, high sensitivity NMR probe and preamplifier for low frequencies", Review of Scientific Instruments 50, pp. 193-200, ISSN 0034-6748, 1089-7623, 1979, 9 pgs.

Jäger, Georg , et al., "Optimal quantum control of Bose-Einstein condensates in magnetic microtraps: Consideration of filter effects", Physical Review A 88, 035601, 2013, 4 pgs.

Khaneja, Navin , et al., "Optimal control of coupled spin dynamics: design of NMR pulse sequences by gradient ascent algorithms", Journal of Magnetic Resonance 172, pp. 296-305, ISSN 1090-7807, 2005, 10 pgs.

Kobzar, Kyryl , et al., "Exploring the limits of broadband 90° and 180° universal rotation pulses", Journal of Magnetic Resonance 225, pp. 142-160, ISSN 1090-7807, 2012, 19 pgs.

Kobzar, Kyryl , et al., "Exploring the limits of broadband excitation and inversion: II. Rf-power optimized pulses", Journal of Magnetic Resonance 194, pp. 58-66, ISSN 1090-7807, 2008, 9 pgs.

Koroleva, Van D. M., et al., "Broadband CPMG sequence with short composite refocusing pulses", Journal of Magnetic Resonance 230, pp. 64-75, ISSN 1090-7807, 2013, 12 pgs.

(56) References Cited

OTHER PUBLICATIONS

Kurizki, Gershon, et al., "Quantum technologies with hybrid systems", Proceedings of the National Academy of Sciences 112, 13, pp. 3866-3873, ISSN 0027-8424, 1091-6490, 2015, 8 pgs.
Ladd, T. D., et al., "Quantum computers", Nature 464, pp. 45-53, ISSN 0028-0836, 2010, 9 pgs.
Levitt, M. H., "Spin Dynamics: Basics of Nuclear Magnetic Resonance", pp. 202-215, Wiley, ISBN 9780471489221, 2001, 7 pgs.
Maas, Stephen A., "Nonlinear Microwave and RF Circuits", Artech House Publishers, Boston, MA, 2nd ed., ISBN 9781580534840, 2.2.8 Nonlinear Inductance, 2003, 15 pgs.
Malissa, H., et al., "Superconducting coplanar waveguide resonators for low temperature pulsed electron spin resonance spectroscopy", Review of Scientic Instruments 84, 025116, ISSN 0034-6748, 1089-7623, 2013, 6 pgs.
Mamin, H. J., et al., "Nanoscale Nuclear Magnetic Resonance with a Nitrogen-Vacancy Spin Sensor", Science 339, pp. 557-560, ISSN 0036-8075, 1095-9203, 2013, 5 pgs.
Mandal, Soumyajit, et al., "Axis-matching excitation pulses for CPMG-like sequences in inhomogeneous fields", Journal of Magnetic Resonance 237, pp. 1-10, ISSN 1090-7807, 2013, 10 pgs.
Mandal, Soumyajit, et al., "Direct optimization of signal-to-noise ratio of CPMG-like sequences in inhomogeneous fields", Journal of Magnetic Resonance 247, pp. 54-66, ISSN 1090-7807, 2014, 13 pgs.
Mehring, Michael, "Principles of High resolution NMR in solids", Second Revised and Enlarged Edition, pp. 111-117, Springer, 1976, 10 pgs.
Mohebbi, H. R., et al., "Composite arrays of superconducting microstrip line resonators", Journal of Applied Physics 115, 094502, ISSN 0021-8979, 1089-7550, 2014, 9 pgs.
Moore, Katharine, et al., "On the relationship between quantum control landscape structure and optimization complexity", The Journal of Chemical Physics 128, 154117, ISSN 0021-9606, 1089-7690, 2008, 13 pgs.
Motzoi, F., et al., "Optimal control methods for rapidly time-varying Hamiltonians", Physical Review A 84, 022307, 2011, 9 pgs.
Müller, M.M., et al., "Optimizing entangling quantum gates for physical systems", Physical Review A 84, 042315, 2011, 8 pgs.
Nelder, J. A., et al., "A simplex method for function minimization", The Computer Journal 7, pp. 308-313, ISSN 0010-4620, 1460-2067, 1965, 6 pgs.
Nurdin, Hendra I., et al., "Coherent Quantum LQG Control", http://arxiv.org/abs/0711.2551v2 [quant-ph], May 24, 2009, 2009, 25 pgs.
Palao, JOSé P., et al., "Protecting coherence in optimal control theory: State-dependent constraint approach", Physical Review A 77, 063412, 2008, 11 pgs.
Pontryagin, L. S., et al., "The Mathematical Theory of Optimal Processes", pp. 12-21, CRC Press, 1987, 13 pgs.
EPO, Communication pursuant to Art. 94(3) EPC, dated Oct. 24, 2018, 19 pgs.
EPO, Communication pursuant to Rule 114(2) EPC (3rd party observations filed), dated Aug. 21, 2018, in EP 15844306.9, 50 pgs.
"IPython", Wikipedia, Aug. 14, 2015, 4 pgs.
"Optimal control", Wikipedia, Jul. 19, 2014, 8 pgs.
Granade, et al., "Practical Characterization and Control of Quantum Systems", http://nbviewer.jupyter.org/github/ cgranade.github.io/ blob/master/research/talks/sandia-2014/slides.ipynb, Jan. 7, 2018, 21 pgs.
WIPO, International Search Report and Written Opinion dated Apr. 25, 2019, in PCT/CA2018/050903, 10 pgs.
Borneman, Troy W, et al., "Bandwith-Limited Control and Ringdown Suppression in High-Q Resonators", http://arXiv:1207.1139v2 [quant-ph], Jan. 21, 2013, 20 pages.
Borneman, et al., "High-Fidelity Control in High-Q Resonators", arXiv:1207.1139v1 [quant-ph], Jul. 4, 2012, 15 pgs.
Borneman, "Techniques for Noise Suppression and Robust Control in Spin-Based Quantum Information Processors", Dept. of Nuclear Science and Engineering, MIT, Dec. 2012, 160 pgs.
Franck, et al., "Active Cancellation—A Means to Zero Dead-Time Pulse EPR", J Magn Reson., Dec. 2015, 15 pgs.
Jiang, et al., "Repetitive Readout of a Single Electronic Spin via Quantum Logic with Nuclear Spin Ancillae", Science, vol. 326, Oct. 9, 2009, 7 pgs.
JPO, Office Action dated Jul. 29, 2019, in JP 2017-511885 (with translation), 6 pgs.
Barends, et al., "Superconducting quantum circuits at the surface code threshold for fault tolerance", Nature 508, 2014, pp. 500-503.
EPO, Communication under Rule 71(3) EPC dated Sep. 5, 2019, in EP 15844306.9, 49 pgs.
Pravia, Marco A., et al., "Robust control of quantum information", The Journal of Chemical Physics 119, pp. 9993-10001, ISSN 0021-9606, 1089-7690, 2003, 10 pgs.
Putz, S., et al., "Protecting a spin ensemble against decoherence in the strong-coupling regime of cavity QED", Nature Physics 10, pp. 720-724, ISSN 1745-2473, 2014, 5 pgs.
Rabitz, H. A., et al., "Quantum Optimally Controlled Transition Landscapes", Science 303, pp. 1998-2001, ISSN 0036-8075, 1095-9203, 2004, 5 pgs.
Rife, Douglas D., et al., "Transfer-Function Measurement with Maximum-Length Sequences", Journal of the Audio Engineering Society 37, 6, pp. 419-444, 1989, 26 pgs.
Rowland, Benjamin, et al., "Implementing quantum logic gates with gradient ascent pulse engineering: principles and practicalities", Philosophical Transactions of the Royal Society of London A: Mathematical, Physical and Engineering Sciences 370, pp. 4636-4650, ISSN 1364-503X, 1471-2962, 2012, 15 pgs.
Schoelkopf, R. J., et al., "Wiring up quantum systems", Nature 451, pp. 664-669, ISSN 0028-0836, 2008, 6 pgs.
Schulte-Herbrüggen, T., et al., "Optimal control for generating quantum gates in open dissipative systems", Journal of Physics B: Atomic, Molecular and Optical Physics 44, 154013, ISSN 0953-4075, 2011, 10 pgs.
Sigillito, A. J., et al., "Fast, low-power manipulaion of spin ensembles in superconducting microresonators", Applied Physics Letters 104, 222407, ISSN 0003-6951, 1077-3118, 2014, 5 pgs.
Skinner, Thomas E., et al., "Reducing the duration of broadband excitation pulses using optimal control with limited RF amplitude", Journal of Magnetic Resonance 167, pp. 68-74, ISSN 1090-7807, 2004, 7 pgs.
Spindler, Philipp E., et al., "Shaped optimal control pulses for increased excitation bandwidth in EPR", Journal of Magnetic Resonance 218, pp. 49-58, ISSN 1090-7807, 2012, 10 pgs.
Taylor, J. M., et al., "High-sensitivity diamond magnetometer with nanoscale resolution", Nature Physics 4, pp. 810-817, ISSN 1745-2473, 2008, 8 pgs.
Tinkham, M., "Introduction to Superconductivity", Second Edition, pp. 237-239, Dover Publications, Mineola, N.Y., ISBN 9780486435039., 2004, 3 pgs.
Tycko, R., "Broadband Population Inversion", Physical Review Letters 51, 9, pp. 775-777, 1983, 3 pgs.
Wimperis, Stephen, "Broadband, Narrowband, and Passband Composite Pulses for Use in Advanced NMR Experiments", Journal of Magnetic Resonance, Series A 109, pp. 221-231, ISSN 1064-1858, 1994, 11 pgs.
Xiang, Ze-Liang, et al., "Hybrid quantum circuits: Superconducting circuits interacting with other quantum systems", Reviews of Modern Physics 85, pp. 623-653, 2013, 31 pgs.
Dolde, Florian, et al., High fidelity spin entanglement using optimal control, Published Feb. 28, 2014, Macmillan Publishers Limited, Nature Communications.†
Dolde, Florian, et al., High fidelity spin entanglement using optimal control, Dated: Sep. 18, 2013, arXiv preprint arXiv:1309.4430. https://arxiv.org/pdf/1309.4430.pdf.†
Christopher Granade, Practical Characterization and Control of Quantum Systems, Presented Jun. 24, 2014 as a seminar at Sandia National Laboratories, Presented Jun. 24, 2014 as a seminar at Sandia National Laboratories, http://nbviewer.jupyter.org/github/ cgranade/cgranade.github.io/ blob/master/research/talks/sandia-2014/

(56) References Cited

OTHER PUBLICATIONS slides.ipynb http://www.cgranade.com/research/talks/sandia-2014/ https://github.com/cgranade/cgranade.github.io/blob/master/research/talks/sandia-2014/index. md.†

\* cited by examiner
† cited by third party

US 10,587,277 B2

GENERATING A CONTROL SEQUENCE FOR QUANTUM CONTROL

CROSS-REFERENCE TO RELATED APPLICATIONS

This application is a U.S. National Phase of PCT/CA2015/000500 filed on Sep. 23, 2015, which claims priority to U.S. Provisional Application Ser. No. 62/054,630, filed on Sep. 24, 2014, which is hereby incorporated by reference.

BACKGROUND

The following description relates to generating a control sequence for control of a quantum system.

Control fields are often used to manipulate quantum systems. For example, a sequence of electromagnetic pulses can be used to control a spin system. Algorithms based on Optimal Control Theory (OCT) have been used to engineer control fields for particular operations. For example, Gradient Ascent Pulse Engineering (GRAPE) provides a framework for using optimal control theory to generate pulse sequences for magnetic resonance applications.

SUMMARY

In a general aspect, a control sequence for a quantum system is generated based on a distortion model.

In some aspects, a control system is configured to interact with a quantum system. The quantum system includes qubits that respond to a control signal generated by the control system, and the control system is configured to generate the control signal in response to an input signal. A control sequence (which may include, for example, a sequence of values for the input signal) can be generated by a computing system based on a target operation to be applied to the qubits. The control sequence can be generated based on the target operation, a quantum system model, a distortion model and possibly other information. The quantum system model represents the quantum system and includes a control parameter representing the control signal. The distortion model represents a nonlinear relationship between the control signal and the input signal. The control sequence can be applied to the quantum system by operation of the control system.

Implementations of these and other aspects may include one or more of the following features. The target operation, the quantum system model and the distortion operator are accessed by an optimization engine to generate the control sequence. Generating the control sequence comprises using optimal control theory to iteratively modify the sequence of values. An uncertainty model represents uncertainty in a parameter of the control system, and the pulse sequence is generated based on the target operation, the quantum system model, the distortion model and the uncertainty model. The control system includes classical control hardware, and the non-linear relationship represents a classical phenomenon.

Implementations of these and other aspects may include one or more of the following features. The quantum system includes a spin system, the control system includes a superconducting resonator device, and the control parameter includes the amplitude and phase of the magnetic field generated by the superconducting resonator device. The input signal is a voltage signal received by the control system, and the distortion model represents a non-linear relationship between the amplitude of the magnetic field and the amplitude of the voltage signal received by the control system.

The details of one or more implementations are set forth in the accompanying drawings and the description below. Other features, objects, and advantages will be apparent from the description and drawings, and from the claims.

DETAILED DESCRIPTION

Figure 1:
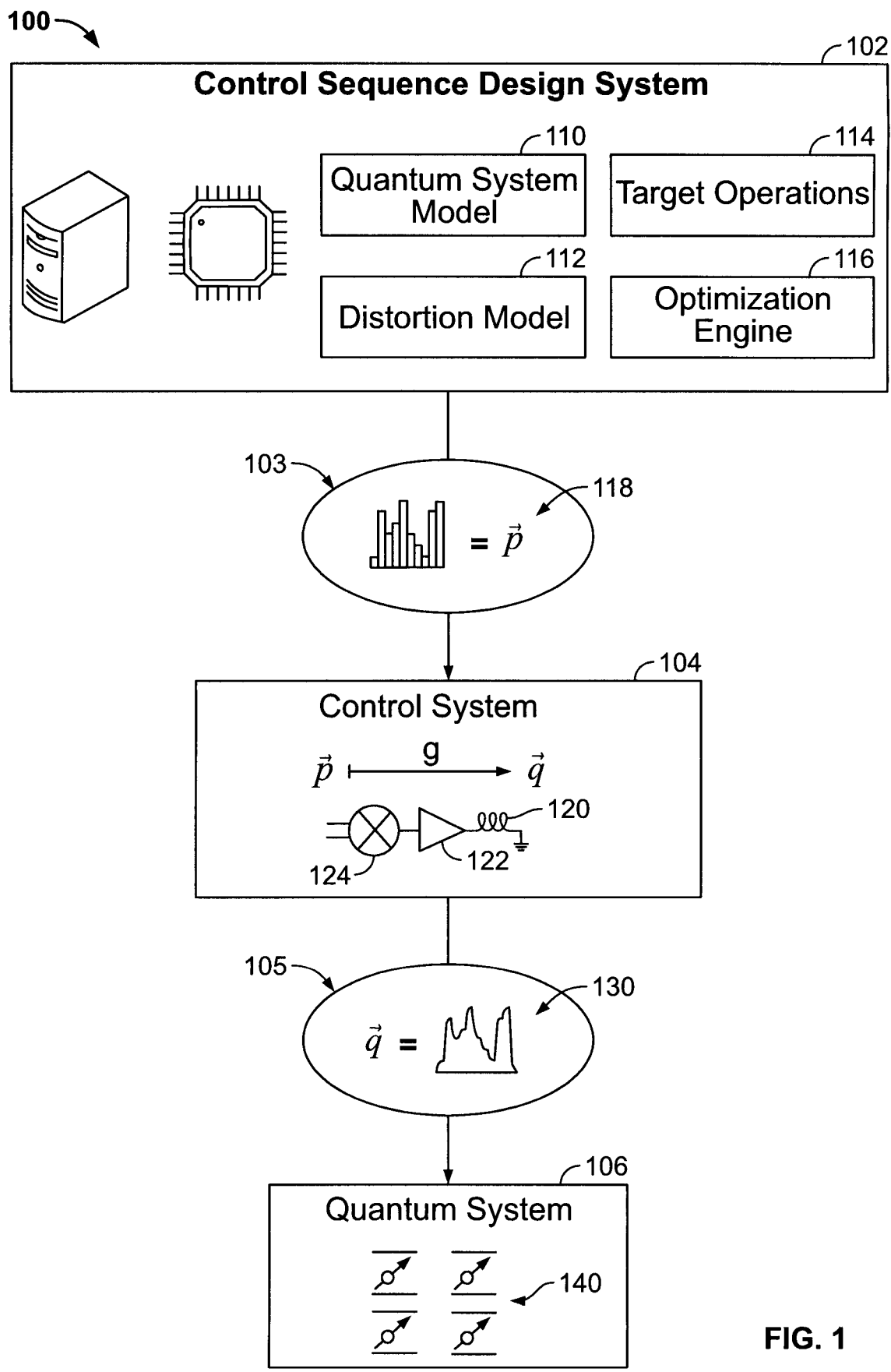
FIG. 1 is a schematic diagram showing an example control sequence design system, an example control system and an example quantum system.

In some aspects of what is described here, a model of classical controller hardware and a description of its operation are incorporated into a general procedure that can produce high fidelity, robust control sequences for quantum devices. In some instances, gates that are robust to variations in the behavior of the classical controller may be designed by including not only a model of the classical controller, but also a description of the uncertainty in the parameters of the same model within the quantum gate optimizing routine.

In some implementations, a model of a classical controller with non-invertible, possibly nonlinear, dynamics can be incorporated into computer-implemented routines that find high fidelity, robust quantum gates or other types of control sequences. For instance, control pulses can be considered as having both an input space and an output space with the classical controller between them. In some cases, the routine is performed by a classical computer that is distinct from the quantum device. After the control sequence is designed, it can be applied by the classical controller, for example, to operate the quantum device.

The demands of classical control infrastructure typically complexify and increase as quantum devices scale. In some cases, the interaction form of classical controllers with quantum devices can be modified to allow such scaling. In some instances, a robust, high-fidelity control sequence for a quantum device can be generated using the example techniques described here. In some instances, the control sequence includes one or more quantum gates or other operations designed to operate on a quantum system (e.g., on one or more qubits in a quantum system). In some cases, the quantum gates are designed to be robust to variations or distortions in the behavior of a classical controller.

In some aspects, a general optimal control framework for designing control sequences can account for hardware control distortions while maintaining robustness to environmental noise. The example techniques described here are demonstrated by presenting examples of robust quantum gates optimized in the presence of nonlinear distortions. In some examples, non-linear classical controllers do not incur additional computational cost for pulse engineering, enabling more powerful quantum devices.

The techniques described here can be used, in some instances, to coherently control the dynamics of quantum systems, such as, for example, quantum computers, actuators, and sensors that push beyond the capabilities of classical computation and metrology. For instance, quantum computation has presented a compelling application for quantum control, as high-fidelity control can be used to implement quantum information processors that achieve fault-tolerance. As quantum information processors and other quantum devices continue to grow in size and complexity, the requirements of classical control hardware also increase in some instances. This can produce situations with a trade-off between hardware response simplicity and overall hardware capability.

In some contexts, the performance of numerically-optimized quantum gates in laboratory applications strongly depends on the response of the classical electronics used to apply the control sequence. Classical hardware models can be included in pulse-finding algorithms such that the produced control sequences are tailored to work robustly for the intended hardware controllers. Such a framework can, in some cases, natively incorporate nonlinear and non-invertible hardware behaviour, and allow for robustness against uncertainties and errors in parameters describing the hardware.

Models of linear distortions of a control sequence, such as those arising from finite bandwidth of the classical control hardware, may be integrated into optimal control theory (OCT) algorithms. Further, such algorithms can be modified to admit hardware models that are non-invertible or non-linear, allowing the experimenter to increase or maximize control efficiency and measurement sensitivity by improving hardware performance without sacrificing the ability to perform robust, high-fidelity quantum control.

In some implementations, a control framework can integrate the system-apparatus dynamics and model hardware components explicitly, such that their effect on a quantum system can be computed and compensated for using numerical optimal control theory (OCT) algorithms to optimize or otherwise improve control sequences. For instance, control sequences designed using OCT algorithms, such as the GRadient Ascent Pulse Engineering (GRAPE) algorithm, can be modified such that they are made robust to a wide variety of field inhomogenities, pulse errors and noise processes. The control framework can also be used in other applications and other protocols.

In some aspects, a control framework can be described generally without making assumptions about the device of interest, so that results may be broadly applicable to a wide range of quantum devices. The theory can be applied to any linear distortion, and we demonstrate with numerics how nonlinearities in control hardware may be included. As an example, we derive high-fidelity control pulses for strongly-driven superconducting resonators exhibiting non-linear kinetic inductance, that are robust to uncertainty in the amount of non-linearity present. While the control framework applies generally to a wide range of quantum control modalities, superconducting resonators serve well as an illustrative test-bed, having found significant recent application in pulsed electron spin resonance (ESR) and circuit QED to increase induction measurement sensitivity and provide an interface for microwave photon quantum memories.

In some aspects, a control framework can be described in the context of controlling a quantum system that has a system Hamiltonian $$H(t) = H_0 + \sum_{l=1}^{L} q_l(t) H_l \tag{1}$$

where $H_0$ is the internal Hamiltonian and $\{H_l\}_{l=1}^{L}$ are the control Hamiltonians. The envelopes $\{q_l(t)\}_{l=1}^{L}$, can be selected such that at time T, the total unitary $U_{target}$ is effected. In some implementations, the control framework is also compatible with similar problems such as state to state transfers, expectation values over static distributions, open system maps, etc.

FIG. 1 is a schematic diagram showing an example system 100 that includes a control sequence design system 102, a control system 104 and a quantum system 106. In some implementations, the system 100 includes additional or different features, and the components of the system can be arranged as shown in FIG. 1 or in another manner.

In the example shown in FIG. 1, the quantum system 106 includes a number of qubits, and the qubits respond to a control signal 105 generated by the control system 104. The control system 104 produces the control signal 105 in response to an input signal received by the control system 104. The input signal received by the control system 104 corresponds to a control sequence 103 produced by the control sequence design system 102.

In some examples, the quantum system 106 includes a spin system (e.g., a spin ensemble or another type of spin system) that includes multiple spins 140. In such examples, the control signal 105 can be a pulse train 130 generated by a resonator circuit 120 in the control system 104. The input signal received by the control system 104 can be, for example, one or more voltage signals that corresponds to a pulse sequence 118 provided by the control sequence design system 102.

In the example shown in FIG. 1, the control sequence design system 102 includes one or more computing systems (e.g., laptop computers, desktop computers, servers, server clusters, etc.) that generate the control sequence 103. The computing systems can include one or more processors (e.g., FPGAs, general-purpose processors, special-purpose processors, logic circuitry, etc.) and computer-readable memory (e.g., random access memory, read-only memory devices, discs, storage devices, etc.). In the example shown in FIG. 1, the computer-readable memory stores data (e.g., files, programs, software, packages of code, etc.) that define a quantum system model 110, a distortion model 112, and an optimization engine 116. In some instances, the computer-readable memory stores data that define one or more target operations 114.

In some implementations, the data processor(s) in the control sequence design system 102 can access the quantum system model 110, the distortion model 112 and the target operations 114 and generate the control sequence 103. For example, the optimization engine 116 can include computer code that is executed by the data processor(s) to produce the pulse sequence 118 based on the quantum system model 110, the distortion model 112, the target operations 114, and other inputs.

In some instances, the control sequence design system 102 defines the parameters of the control sequence 103 such that the control sequence 103 will cause the control system 104 to produce a control signal 105 that performs the target operation on the quantum system 106. For example, the parameters of the control sequence 103 can include the parameters (e.g., duration, power, phase, etc.) of individual pulses in the pulse sequence 118, and the parameters of the pulse sequence 118 define the voltage signals delivered to the control system 104. In response to receiving the voltage signals, the resonator circuit 120 can produce the pulse train 130 that is experienced by the spins 140, and the spins 140 evolve under the pulse train 130 in a manner that corresponds to the target operations 114.

In some cases, the quantum system model 110 includes a control parameter that represents the control signal 105. In the example shown, the quantum system model 110 can be or include the Hamiltonian H(t) (e.g., the example Hamiltonian in Equation 1 or another Hamiltonian), and the control parameter in the quantum system model 110 can be the magnetic field parameter ($\vec{q}$). Other types of control parameters may be used.

In some implementations, the distortion model 112 represents a nonlinear relationship between the control signal experienced by the quantum system 106 and the input signal received by the control system 104. In the example shown, the distortion model 112 represents the nonlinear relationship between the pulse sequence 118 produced by the control sequence design system 102 and the pulse train 130 produced by the control system 104. The nonlinear relationship can be caused, for example, by one or more components of the control system 104. For instance, the control system 104 may include classical hardware components (e.g., one or more components of the resonator circuit 120, an amplifier 122, a mixer 124, etc.) that cause nonlinearities at least in certain operating regimes.

In some examples, the control system 104 includes a superconducting resonator device that has a linear operating regime and a nonlinear operating regime, and the nonlinear relationship between the input signal received by the control system 104 and the control signal 105 produced by the control system 104 occurs when operating the superconducting resonator device in the nonlinear operating regime. For instance, the pulse sequence 118 can be applied to the spins 140 by operating the superconducting resonator device in its nonlinear operating regime. In such examples, the distortion model 112 accounts for the nonlinear dynamics of the resonator circuit 120 in the nonlinear operating regime. In some examples, the distortion model 112 accounts for nonlinear effects from other hardware (e.g. the amplifier 122, the mixer 124, etc.) in the control system 104. The nonlinear relationship represented by the distortion model 112 can arise due to classical (i.e., non-quantum) phenomena that occur in the resonator circuit 120 or other classical hardware components of the control system 104.

In some implementations, the optimization engine 116 generates the control sequence 103 based on one or more algorithms that begin with an initial set of parameters (e.g., an initial "guess") and iteratively modifies the set of parameters until reaching a termination condition. For instance, the termination condition can be or include a number of iterations executed by the algorithm, a number of pulses in a pulse sequence, a threshold (maximum or minimum) duration of pulses in a pulse sequence, a threshold (maximum or minimum) duration of the control sequence, a threshold (maximum or minimum) for one or more quality criteria, or a combination of these. The quality criteria can include one or more objective functions that are improved or optimized by the optimization engine 116 based on the target operation 114. For instance, the optimization functions can include the fidelity between a simulated operation and a target unitary operation, the fidelity between a simulated quantum state and a target quantum state, or a combination of these and other types of optimization functions.

In some implementations, the optimization engine 116 generates the control sequence 103 using optimal control theory to find control sequence parameters that optimize an objective function under constraints defined by the quantum system model 110, the distortion model 112, the target operations 114, and possibly other constraints. As an example, the Gradient Assent Pulse Engineering (GRAPE) algorithm provides a framework for using optimal control theory to generate pulse sequences for magnetic resonance applications. The framework provided by the GRAPE algorithm or another optimal control theory algorithm can be modified to include the distortion model 112 that accounts for non-linear dynamics in the control system 104, and possibly other types of models and related information.

In the example shown, the functions $\{q_l(t)\}_{l=1}^{L}$ seen by the quantum system represent a distorted version of what was input to the classical hardware. In a numerical description, the time domain can be discretized and relevant hardware can be modeled by a discretized distortion operator. Here, the discretized distortion operator is a function g: $R^N$ $\textcircled{z}R^K \rightarrow R^M \textcircled{x} R^L$ which takes an input pulse sequence, $\vec{p}$, with some associated time step dt, and outputs a distorted version of the pulse, $\vec{q}=g(\vec{p})$, with an associated time step δt. Here, the vector $\vec{p}$ represents the pulse as generated by the control sequence design system 102, and the vector $\vec{q}$ represents the pulse generating the Hamiltonian seen by the quantum system 106, as illustrated in FIG. 1.

The integers N and M represent the number of input and output time steps respectively, and K and L represent the number of input and output control fields respectively. In the case of on-resonant quadrature control of a qubit, K=L=2. In this discussion, we omit subscripts on the time steps dt and δt for notational simplicity; uniform time discretization is not required. In some cases, the condition δt<dt allows for an accurate simulation of the quantum system. The condition M·δt=N·dt need not hold, for example, M·δt>N·dt may be useful when the distortion has a finite ringdown time.

The discretized distortion operator g can often be derived from a continuous distortion operator f: $L_1(R, R^K) \rightarrow L_1(R, R^L)$ which takes a continuous input pulse α(t) and outputs a distorted pulse β(t)=f[α](t). The discretized version can be obtained by composing f on either side by a discretization and dediscretization operator, $g=f_1 \circ f \circ f_2$.

In some examples, conventional techniques from optimal control theory can be modified to include the distortion operator g. For instance, consider the unitary objective function, $$\Phi[\vec{q}] = \left| Tr\left( U_{target}^\dagger \prod_{m=1}^M e^{-i\delta t\left(H_0 + \sum_{l=1}^L q_{m,l}H_l\right)} \right) \right|^2 / d^2, \quad (2)$$

used in the GRAPE algorithm, where d is the Hilbert space dimension, used to normalize the objective function to the unit interval. Penalties can be added to this basic objective function in order to demand that the solution admit certain properties. For instance, penalty functions have been used to ensure robustness to control noise and limited pulse fluence or to ensure that undesired subspaces are avoided.

In some implementations, the effect of control hardware can be incorporated by modifying the objective function to compose with the distortion operator, $$\Phi_g[\vec{p}] = \Phi \circ g(\vec{p}). \quad (3)$$

Using the multivariable chain rule, we compute the gradient of $\Phi_g$ to be $$\nabla_{\vec{p}}(\Phi_g) = \nabla_{g(\vec{p})}(\Phi) \cdot J_{\vec{p}}(g) \quad (4)$$

$$[J_{\vec{p}}(g)]_{m,l,n,k} = \frac{\partial g_{m,l}}{\partial p_{n,k}} \quad (5)$$

where the dot represents a contraction over the indices m and l, and where $J_{\vec{p}}(g)$ is the Jacobian of g at $\vec{p}$. Though evaluating $\nabla_{g(\vec{p})}(\Phi)$ can be accomplished by simulating the action of M×L pulses, the GRAPE algorithm provides an expression for this gradient in terms of the timestep unitaries that are already computed, $$\frac{\partial \Phi}{\partial q_{m,l}} = -2\mathrm{Re}[\langle P_m | i\delta t H_l X_m \rangle\langle X_m | P_m \rangle], \quad (6)$$

where $$P_m := \left(\prod_{i=m+1}^M U_i^\dagger\right) U_{target},$$

$$X_m := \prod_{i=m}^1 U_i$$

and where $$U_i(\vec{q}) = \exp\left(-i\delta t\left[H_0 + \sum_{l=1}^L q_{m,l}H_l\right]\right).$$

Therefore if we can compute the Jacobian $J_{\vec{p}}(g)$, we can then compute the total gradient of $\Phi$. In some cases, the rest of the algorithm can follow, for example, as in the conventional GRAPE algorithm. Since the cost of evaluating g will typically not grow more than polynomially with the number of qubits, the computational cost of executing the algorithm can effectively remain unchanged from the conventional GRAPE algorithm, as it is still dominated by the cost of computing the M matrix exponentials.

Although the GRAPE algorithm is described as an example routine for improving or optimizing the objective function, this choice is based largely on the favourable convergence properties of the algorithm, and does not prevent the use of a different routine. In particular, GRAPE is a greedy algorithm which attempts to find an optimum closest to the initial value by choosing a direction related to the steepest uphill slope. Global optimizers such as Nelder-Mead, genetic algorithms, or hybrid gradient algorithms could be used without modification by substituting the usual objective function, $\Phi$, with the distortion modified objective function, $\Phi_g$. Such routines may be useful, for instance, in cases where the control landscape is known to be saturated with suboptimal maxima. Gradient-free methods may be advantageous, for instance, in cases where it is difficult or overly expensive to compute the Jacobian tensor of $\Phi_g$.

Making use of the abstract formalism described above, our first example is the continuous distortion operator given by the convolution with an L×K kernel $\phi(t)$, $$\beta(t) = f(\alpha)(t) = (\phi * \alpha)(t) = \int_{-\infty}^\infty \phi(t-\tau) \cdot \alpha(\tau)d\tau. \quad (7)$$

The convolution kernel $\phi$ can model distortions that can be described by a linear differential equation, such as a simple exponential rise time, control line crosstalk, or the transfer function of the control hardware. We compute the discretized distortion operator to be $$q_{m,l} = \sum_{n=1, k=1}^{N,K} \left(\int_{(n-1)dt}^{ndt} \phi_{l,k}((m-1/2)\delta t - \tau)d\tau\right) p_{n,k}. \quad (8)$$

where we see that it acts as a linear map, $$\vec{q} = g(\vec{p}) = \tilde{\phi} \cdot \vec{p}, \quad (9)$$

where we are contracting over the n and k indices with the components of the tensor $\tilde{\phi}$ given by the integrals $$[\tilde{\phi}]_{m,l,n,k} = \int_{(n-1)dt}^{ndt} \phi_{l,k}((m-1/2)\delta t - \tau)d\tau. \quad (10)$$

In this example, the Jacobian matrix can be given by $J_{\vec{p}}(g) = \tilde{\phi}$ which is independent of the pulse $\vec{p}$. Examples of specific linear distortions making use of this formula include a resonator or cavity with a large quality factor Q, and others. As a specific example, a resonator or cavity with a large quality factor Q can store energy for times that are long compared to the time steps that are used in pulse design. If this effect is not included in optimization by integrating the distortion differential equation for a sufficient period, then the integrated action of the pulse on the quantum system may not be accurate. This can be dealt with by defining the image of the distortion operator to represent a longer time interval than the domain, but this may be inconvenient in experimental practice (e.g., where there is a need to turn off a pulse quickly). An alternative is to actively compensate for the ringdown introduced by a large Q, and to demand that the distorted pulse goes to zero at a given time step.

For a resonator with only linear elements, this problem has been solved by appealing to the transfer function $h: \mathbb{R}^m \to \mathbb{R}^K$, $$g[\vec{p}] = f_1[f_2(\vec{p}) * h] \quad (12)$$

where å is the convolution operator. For the case M=K=1, the transfer function takes on the simple form $$h(t) = Ae^{-t/\tau_c} \quad (13)$$

for some amplitude A and where $\tau_c = Q/\omega_0$ is a time constant. In this case, an additional pulse segment, of amplitude $$p_{K+1} = -A \frac{g[\vec{p}]_m}{e^{\delta t/\tau_c} - 1}, \quad (14)$$

can be appended, where m is a time step index such that $t_m = t_K$.

In the nonlinear case, Q, $\omega_0$ and A are not constant, but depend on $\vec{p}$. One solution is to modify the performance functional to include the demand that the ringdown go to zero by defining $$\Phi'_g(\vec{p}) := \Phi_g(\vec{p}) - \Omega_g(\vec{p}) = (\Phi + \Omega) \circ g. \quad (15)$$

For ringdown compensation, $$\Omega_{RD} := \sum_{m=m_0}^{M} |p_m|^2, \quad (16)$$

where $m_0$ is the time step index at which we start demanding that the solution goes to zero. The derivatives of this function are found, such that $\vec{\nabla}\Phi'$ is computed given $\vec{\nabla}\Phi$ and $J(g)$. Since a solution that both has high fidelity with a unitary target and admits ringdown compensation can be hard to find in some instances, a ringdown-compensation method can be used to generate initial guesses which result in a small penalty $\Phi'_g(\vec{p})$.

Another solution is to include ringdown suppression in the distortion operator g itself. That is, given an input pulse $\vec{p}$, the forcing term $\alpha$ now includes not only steps taken directly from $\vec{p}$, but also additional steps which are chosen (according to the results from the next section) to eliminate the energy from the cavity in a short period of time. This technique was used in the examples described here.

Here, we derive a scheme to calculate the values of compensation steps to append to a pulse which acts to remove the energy from a resonator on a timescale shorter than the ringdown time. First, we write the equation of the circuit as $$\dot{x} = Ax + \alpha b \quad (17)$$

where x is a vector of state variables for the circuit, A is a matrix describing the circuit without forcing, b is the forcing direction of the circuit, and α is a controllable scalar which sets the magnitude of the forcing. Here, we assume that we have already entered the frame rotating at the resonance frequency so that all quantities are complex, where real quantities correspond to in-phase components, and imaginary quantities correspond to quadrature components. Note that for a non-linear circuit, A will depend on the state of the system, that is, $A = A(x)$. Moreover, α can be time dependent, $\alpha = \alpha(t)$.

In some implementations, the objective is to start with an undistorted pulse $\vec{p}_0$ and append $n_{rd}$ steps of length $dt_{rd}$ to form the undistorted pulse $\vec{p} = [\vec{p}_0, \vec{p}_{rd}]$, which causes the distorted pulse $g(\vec{p})$ to have near zero amplitude at the end of the last time step. To simplify the task, we can make the approximation that A remains constant during each of the compensation steps, taking on a value corresponding to the state x at the end of the previous time step.

The general solution to Equation 17 is given by $$x(t) = e^{tA} x_0 + \int_0^t \alpha(s) e^{(t-s)A} b \, ds. \quad (18)$$

Substituting a continuous forcing solution and translating the time coordinate so that $t=0$ corresponds to the transition from the $(n-1)^{th}$ to the $n^{th}$ and gives the solution $$x(t) = e^{tA} x_0 + e^{tA} \left[ \int_0^t e^{-sA} (\tilde{p}_{n-1} + (\tilde{p}_n - \tilde{p}_{n-1})(1 - e^{-s/\tau_r})) ds \right] b \quad (19)$$
$$= e^{tA} x_0 + [\tilde{p}_n A^{-1}(e^{tA} - I) - (\tilde{p}_n - \tilde{p}_{n-1})(A + I/\tau_r)^{-1}(e^{tA} - e^{-t/\tau_r} I)] b$$

in the region $t \in [0, dt_{rd}]$. In some instances, we wish to drive the state of the system, x, to 0. Therefore, we can demand that at time $t = dt_{rd}$, x becomes some fraction of its value at the end of the $(n-1)^{th}$ step, so that $x(dt_{rd}) = rx_0$ for some $r \in [0,1]$. We can refrain from setting $r=0$ when x is large because if x changes too much in the time span $dt_{rd}$ our approximation of constant A will break down. In cases where only the value of $\tilde{p}_n$ can be changed, the equality $x(dt_{rd}) = rx_0$ will not in general be achievable. Thus, we may instead minimize the quantity $$\beta(\tilde{p}_n) = \|P(x(dt_{rd}) - rx_0)\|_2 \quad (20)$$

where P is a positive semi-definite matrix which relates the importance of minimizing certain state variables over others. This quantity can be rewritten as $$\beta(\tilde{p}_n) = \|w - \tilde{p}_n v\|_2$$
$$w = P[(e^{tA} - rI)x_0 + \tilde{p}_{n-1}(A + I/\tau_r)^{-1}(e^{tA} - e^{-t/\tau_r} I)] b$$
$$v = P[(A + I/\tau_r)^{-1}(e^{tA} - e^{-t/\tau_r} I) - A^{-1}(e^{tA} - I)] b \quad (21)$$

This form shows that $\beta(\tilde{p}_n)$ is minimized when $\tilde{p}_n$ is chosen to be the complex projection amplitude of the vector w onto v:

$$\tilde{p}_n = \frac{\langle v, w \rangle}{\langle v, v \rangle}. \quad (22)$$

For reference, note that in the limit $\tau_r \to 0$, the vectors v and w simplify to $$w = P(e^{tA} - rI)x_0$$
$$v = -PA^{-1}(e^{tA} - I)b. \quad (23)$$

In some cases, if there are uncertainties in any parameters $\vec{a}$ describing the convolution kernel, so that $\phi(t) = \phi[\vec{a}](t)$, then the objective function used in the optimization routine can be taken as a weighted sum, $$\Phi_{g,\langle \vec{a} \rangle} = \sum_{\vec{a}} Pr(\vec{a}) \Phi_{g[\vec{a}]} \quad (24)$$

where $g[\vec{a}](\vec{p}) = \tilde{\phi}[\vec{a}] \cdot \vec{p}$ and the probability distribution $Pr(\vec{a})$ describes the parameter uncertainty. In this way, the control sequence design system may attempt to find a solution which performs well over all probable parameter values. As a concrete example, if $\tau_{rise}$ were the characteristic rise time of a control amplitude, we could have $\vec{a}=(\tau_{rise})$, and generate a pulse which is robust to variations in this time scale. By linearity, the Jacobian tensor of $\Phi_{g,(\vec{a})}$, is the weighted sum of the Jacobian tensors $J_{\vec{p}}(g[\vec{a}])$. In some cases, incorporating distributions of parameters in the distortion operator also applies to non-linear device hardware.

Figure 2:
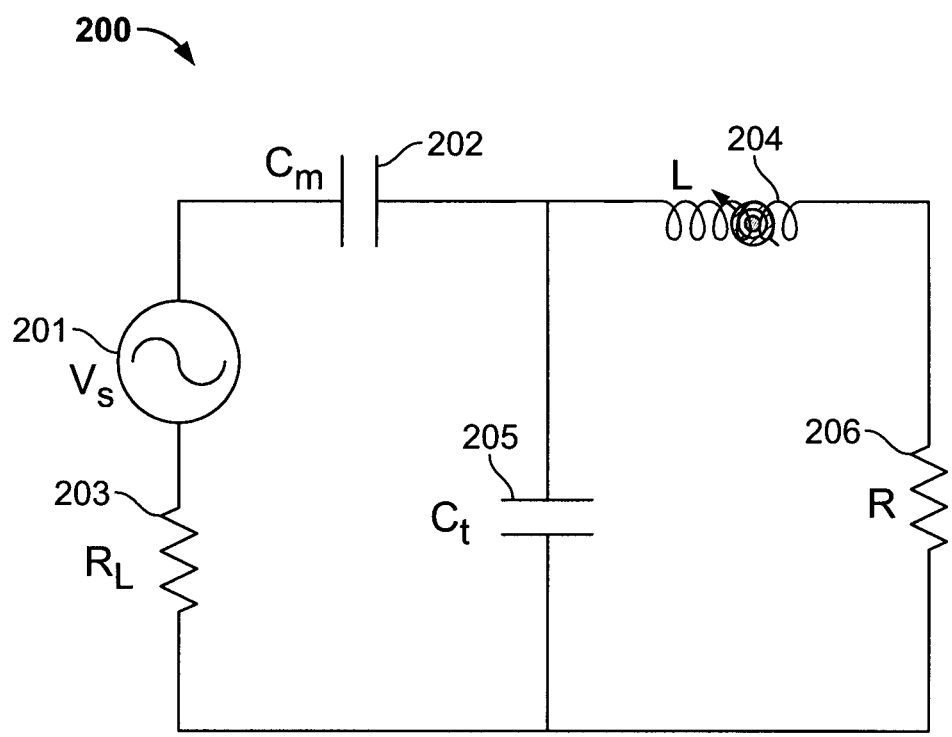
FIG. 2 is a diagram of an example circuit model for a resonator circuit in a control system.

As another example, we consider a quantum system being controlled by a tuned and matched resonator circuit with nonlinear circuit elements. For this example, FIG. 2 provides a diagram of an example circuit model 200 for a resonator circuit in a control system. For example, the circuit model 200 can represent the resonator circuit 120 in the control system 104 shown in FIG. 1. In some instances, the resonator circuit 120 is represented by a different circuit model. The example circuit model 200 shown in FIG. 2 includes a voltage source 201, a first capacitor 202 having capacitance $C_m$, a first resistor 203 having resistance $R_L$, an inductor 204 having inductance L, a second capacitor 205 having capacitance $C_t$, and a second resistor 206 having resistance R. The circuit model for a resonator device may include additional or different features, and a resonator device may operate in another manner.

In the example shown in FIG. 2, the voltage source 201 can represent an ideal voltage source that corresponds to a control sequence. For instance, the voltage source 201 may represent the input signal that is delivered to the control system 104 when the pulse sequence 118 is executed. Typically, the voltage source is a time-varying voltage signal that can be controlled by an external system, for example, to control operation of the resonator circuit.

The example inductor 204 is configured to produce a magnetic field that interacts with a spin system. For instance, the inductor 204 can represent a component of an ESR resonator device that generates a microwave-frequency electromagnetic field that controls an electron spin system in an ESR sample, or the inductor 204 can represent an NMR coil that generates a radio-frequency electromagnetic field that controls a nuclear spin system in an NMR sample. Other types of inductors and cavities, and other types of qubit systems can be used.

The circuit model 200 can be used to compute the control signal generated by the resonator circuit in response to a particular voltage signal (e.g., a particular pulse sequence or other type of voltage signal). For example, the voltage source 201 can be modeled according to a pulse sequence, and the resulting current through the inductor 204 and other components of the circuit model 200 can be computed.

The example circuit model 200 shown in FIG. 2 can operate in a nonlinear regime. For example, in the nonlinear regime, the inductance of the inductor 204 or the resistance of the resistor 206 (or both) are functions of the current passing through them. For instance, the nonlinearities may be consistent with kinetic inductance.

In some cases, the circuit model 200 is used to generate a distortion model that represents a nonlinear relationship between an input signal provided by the voltage source 201 and a control signal produced by the inductor 204. For example, the system of differential equations in Equation 26 provides an example of a nonlinear relationship between a voltage signal and inductance of the inductor 204 that produces the control signal to control the quantum system.

This example has a form that is general enough to accurately describe the majority of resonators currently used in spin resonance experiments, including non-linear resonators. Moreover, arbitrarily-complex circuits with additional poles could be incorporated, for instance, by finding their circuit equations with a standard application of Kirchhoff's laws, resulting in a higher order equation in place of Equation 26.

Nonlinear superconducting resonators are used in a variety of applications, including circuit QED for quantum information processing and quantum memories, microwave kinetic inductance detectors for astronomy, and pulsed electron spin resonance. Often, these devices are operated in their linear regime to avoid complications resulting from nonlinearity. Avoiding nonlinearities can require reducing input power, leading to longer control sequences that reduce the number of quantum operations that can be performed before the system decoheres. Additionally, limiting input power can remove the natural robustness of high-power sequences to uncertainties in the environment achieved by strongly modulating the quantum system.

If the circuit were linear, the distortion could be modelled as a convolution $\phi^*$ as discussed above. However, with nonlinear circuit elements present, we can numerically solve the circuit's differential equation to compute the distorted pulse.

As a first demonstration, we consider a qubit system. This example isolates the change in a control landscape induced by the non-linear distortion operator, and control landscapes generally scale well with Hilbert space dimension. In this example, a qubit is a near-resonance spin system whose Hamiltonian, in the rotating frame after invoking the rotating wave approximation, is $$H = \frac{\delta\omega}{2}\sigma_z + (1+\kappa)\left(\frac{\omega_x(t)}{2}\sigma_x + \frac{\omega_y(t)}{2}\sigma_y\right) \qquad (25)$$

where $\delta\omega$ and $\kappa$ represent off-resonance and control power errors, respectively.

In some implementations, the time evolution of the circuit represented by the example circuit model 200 in FIG. 2 is governed by the third order differential equation $$\frac{d}{dt}\begin{bmatrix} I_L \\ V_{C_m} \\ V_{C_t} \end{bmatrix} = \begin{bmatrix} -\frac{R}{L} & 0 & \frac{1}{L} \\ 0 & \frac{-1}{R_L C_m} & \frac{1}{R_L C_m} \\ -\frac{1}{C_t} & \frac{-1}{R_L C_t} & \frac{1}{R_L C_t} \end{bmatrix}\begin{bmatrix} I_L \\ V_{C_m} \\ V_{C_t} \end{bmatrix} + \begin{bmatrix} 0 \\ \frac{V_s(t)}{R_L C_m} \\ \frac{V_s(t)}{R_L C_t} \end{bmatrix} \qquad (26)$$

where the nonlinearities arise when the inductance, L, and resistance, R, are functions of the current passing through them. In the case of kinetic inductance, these nonlinearities take on the form $$L = L(I_L) = L_0(1 + \alpha_L |I_L|^2)$$

$$R = R(I_R) = R_0(1 + \alpha_R |I_R|^\eta) \qquad (27)$$

where $\alpha_L$, $\alpha_R$ and $\eta$ are constants. Kinetic inductance may lead to a reduction in the circuit resonance frequency, coupling, and quality factor with increasing power as shown, for example, in FIGS. 3A and 3B.

Figure 3A:
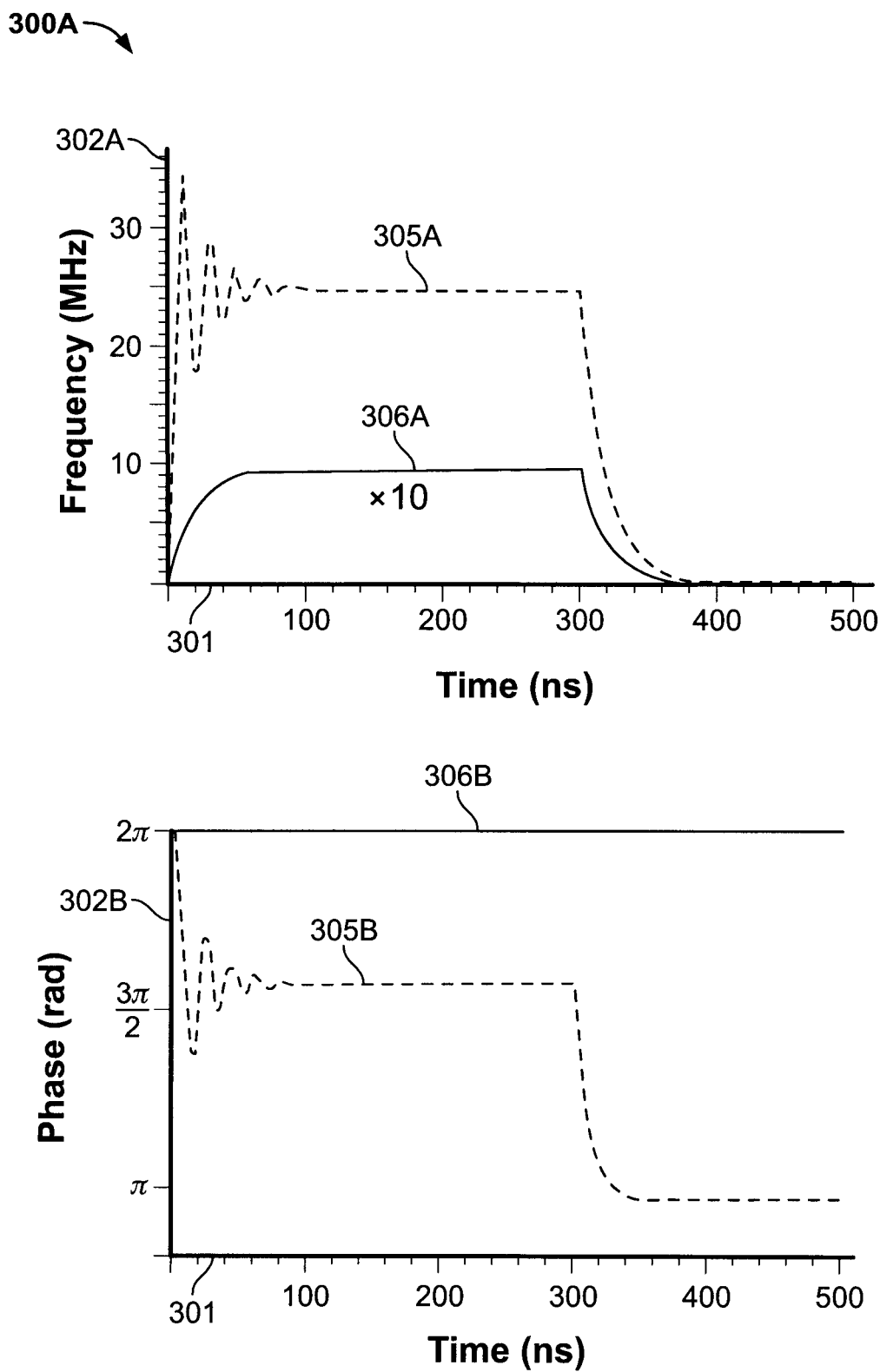
FIG. 3A shows a plot 300A of two example control signals generated by the same example resonator circuit.

FIG. 3A shows a plot 300A of two example control signals generated by the same example resonator circuit. The example plot 300A includes a vertical axis 302A that represents the power of the control signal and another vertical axis 302B that represents the phase of the control signal. Both vertical axes are shown with a horizontal time axis 301. The control signal power represented by the vertical axis 302A is shown in frequency units (in particular, MHz), the control signal phase represented by the vertical axis 302B is shown in units of radians, and the time range represented by the horizontal time axis 301 is shown in units of nanoseconds (ns).

In the example plot 300A shown in FIG. 3A, a first control signal generated by the resonator circuit is represented by the dashed lines 305A, 305B; and a second control signal generated by the same resonator circuit is represented by the solid lines 306A, 306B. The power of the second control signal represented by the solid line 306A is multiplied by a factor ten (10) in the plot for visibility. Both control signals are generated by the resonator circuit in response to a square input signal lasting 300 ns. In particular, the input voltage signal is switched from zero amplitude to a constant pulse amplitude at zero (0) ns in the plot, and the input voltage signal is switched from the constant pulse amplitude back to zero (0) amplitude at 300 ns in the plot. For the first control signal, the pulse amplitude is 10 V, which causes the resonator circuit to operate in a nonlinear regime. For the second control signal, the pulse amplitude is a 0.1 V, which causes the resonator circuit to operate in a linear regime. Thus, the first control signal, represented by the dashed lines 305A, 305B is generated by the resonator circuit in the nonlinear regime, and the second control signal, represented by the solid lines 306A, 306B is generated by the resonator circuit in the linear regime.

As shown in FIG. 3A, the second control signal (in the linear regime) has a constant phase over the entire duration of the pulse; starting at 0 ns, the power of the second control signal (in the linear regime) rises monotonically from zero (0) MHz to a constant value, and starting at 300 ns, the power of the second control signal decreases monotonically from the constant value back to zero (0) MHz. By contrast, the first control signal (in the nonlinear regime) has a substantially different response. In particular, the phase of the first control signal (in the nonlinear regime) fluctuates above and below a center value before stabilizing to the center value at about 100 ns, and the power of the first control signal (in the nonlinear regime) fluctuates above and below a center value before stabilizing to the center value at about 100 ns. After 300 ns, the power of the second control signal decreases monotonically from a stable value back to zero, and the phase of the second control signal changes monotonically from a stable value to a different phase (pi radians).

In the example shown in FIG. 3A, the fluctuations in the first control signal between zero and 100 ns are caused by nonlinearities in the resonator circuit. As shown by this example, increasing the input signal voltage from the linear regime to the nonlinear regime of the resonator circuit does not simply cause a linear increase in the control signal produced by the resonator circuit. Instead, increasing the input signal voltage into the nonlinear regime of the resonator circuit causes the "ringing" behavior represented by the fluctuations between zero and 100 ns. In some instances, this nonlinear relationship between the input signal and a control signal can be incorporated in a distortion model so that the input signal can be engineered to perform a particular operation on the quantum system.

Figure 3B:
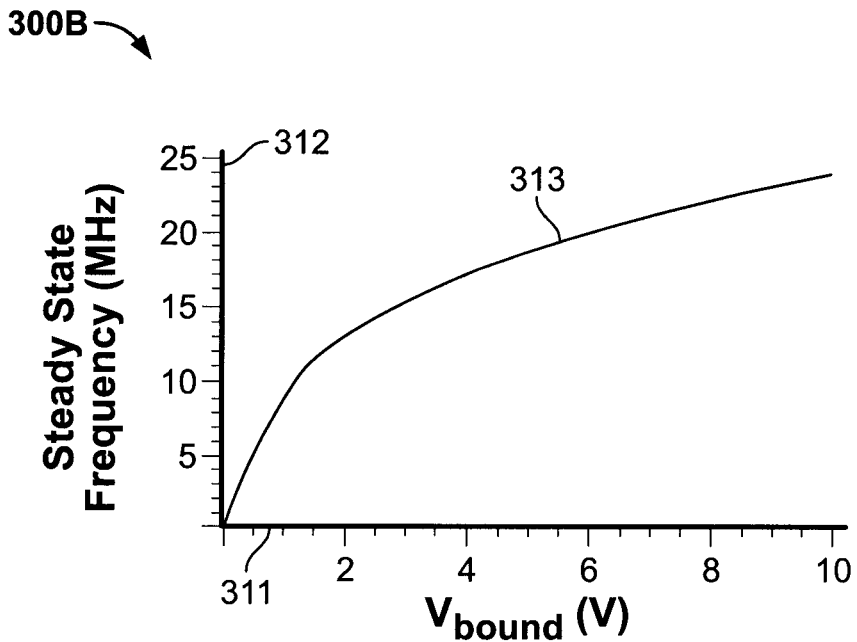
FIG. 3B shows a plot 300B of the steady-state power experienced by a spin system as a function of the voltage bound for the input voltage signal that drives the resonator circuit.

FIG. 3B shows a plot 300B of the steady-state power experienced by a spin system as a function of the voltage bound for the input voltage signal that drives the resonator circuit. The example plot 300B includes a vertical axis 312 that represents the power of the control signal and a horizontal axis 311 that represents a voltage bound of the input voltage signal. The control signal power represented by the vertical axis 312 is shown in frequency units (MHz), and the voltage bound represented by the horizontal axis 311 is shown in units of volts. In FIG. 3B, the relationship between the control signal power and the voltage bound is represented by the line 313. As shown in this example, the steady-state frequency increases monotonically, but not linearly, with the voltage bound.

Since the Hamiltonian in Equation 25 is written in a frame rotating at the circuit resonance frequency in the linear regime, it is convenient to write the differential equation in this frame. To this end, with the differential Equation 26 shorthanded as $$\dot{\vec{y}}(t) = B(\vec{y}(t))\vec{y}(t) + V_s(t)\vec{b},$$

the complex change of variables can be introduced as $$\vec{x}(t) = e^{-i\omega_0 t}\vec{y}(t).$$

In this new frame, since $$B(\vec{y}(t)) = B(\vec{x}(t)),$$

the dynamics become $$\dot{\vec{x}}(t) = (B(\vec{x}(t)) - i\omega_0 I)\vec{x}(t) + \tilde{V}_s(t)\vec{b} \equiv A(\vec{x}(t))\vec{x}(t) + \tilde{V}_s(t)\vec{b} \quad (28)$$

where the rotating wave approximation has been invoked, and $\tilde{V}_s(t)$ is the rotating version of $V_s(t)$. Now the real and imaginary parts of the complex current in the rotating frame, $\tilde{I}_L(t) = e^{-i\omega_0 t}I_L(t)$, are proportional via a geometric factor to the control amplitudes appearing in the Hamiltonian, $$\omega_x(t) \propto \text{Re}[\tilde{I}_L(t)] \text{ and } \omega_y(t) \propto \text{Im}[\tilde{I}_L(t)]. \quad (29)$$

In some instances, to compute the distortion $\vec{q} = g(\vec{p})$ caused by the resonator circuit, the circuit's input voltage $\tilde{V}_s(t)$ can be set to be the piecewise-constant function with amplitudes coming from $\vec{p}$. To improve stiffness conditions, a small finite risetime may be added to the forcing term $\tilde{V}_s(t)$, which is equivalent to adding a low-pass filter to the ideal voltage source in the circuit. We can now solve the Equations 28 for $\tilde{I}_L(t)$ using the NDSolve function in Mathematica 10, interpolate the results, and resample at a rate $\delta t$ to determine the distorted pulse $\vec{q}$.

In some instances, when the distortion is non-linear, the Jacobian of g will not be constant with respect to the input pulse $\vec{p}$. However, the accuracy of the Jacobian can be compromised in favour of taking a larger number of ascent steps that are still generally uphill by using the approximation $$\left.\frac{\partial g_{m,l}}{\partial p_{n,k}}\right|_{\vec{p}} \approx [g(\varepsilon\vec{e}_{n,k})/\varepsilon]_{m,l}. \quad (30)$$

These quantities may be precomputed prior to gradient ascent and therefore only add a constant to the computation time. Exact partial derivatives may be computed for a cost that scales as K·N and whose implementation can be highly parallelized. In some examples, partial derivatives may be computed in this context using techniques outlined in the following discussion. To populate elements of the Jacobian tensor $J_{\vec{p}}(g)$, partial derivatives of the form $$\frac{\partial g_{m,l}}{\partial p_{n,k}} \tag{31}$$

can be approximated, where g is the distortion corresponding to the non-linear resonator circuit. One example technique for approximating such partial derivatives would be to use a central difference formula $$\frac{\partial g_{m,l}}{\partial p_{n,k}} \approx \left[ \frac{g(\vec{p} + \varepsilon \vec{e}_{n,k}) - g(\vec{p} - \varepsilon \vec{e}_{n,k})}{2\varepsilon} \right]_{m,l}, \tag{32}$$

where $\vec{e}_{n,k}$ is the unit vector in the {n, k} direction, and $\varepsilon > 0$ is a small number that is greater than the precision of the DE solver. Such an approximation would utilize 2NK calls to the DE solver. In some cases, the approximation is numerically unstable as it involves the difference of two numerical DE solutions whose forcing terms are only slightly different; $\varepsilon$ can be carefully tuned or may have no reliable value, for instance, when searching for high fidelity pulses.

If we consider the approximation $$g(\vec{p} \pm \varepsilon \vec{e}_{n,k}) \approx g(\vec{p}) \pm g(\varepsilon \vec{e}_{n,k})$$

the central difference reduces to $$\frac{\partial g_{m,l}}{\partial p_{n,k}} \approx [g(\varepsilon \vec{e}_{n,k})/\varepsilon]_{m,l}, \tag{33}$$

which is the approximation provided above in Equation 30. This approximation does not depend on the current pulse $\vec{p}$ and can therefore be pre-computed eliminating the 2NK calls to g (i.e. DE solver calls) per ascension step.

An exact method to compute these partial derivatives is derived below, which will take N*K+1 calls to the DE solver to compute the entire Jacobian matrix. Begin with the resonator differential equation $$\dot{x} = A(x)x + \alpha(t)b. \tag{34}$$

As discussed, we have $$[g(\vec{p})]_{m,1} = \kappa \operatorname{Re} \tilde{I}_L(t_m) \equiv h_1(x(t_m))$$

$$[g(\vec{p})]_{m,2} = \kappa \operatorname{Im} \tilde{I}_L(t_m) \equiv h_2(x(t_m)) \tag{35}$$

where $t_m = (m - \frac{1}{2})\delta t$. Thus, in some instances, the difficult part of computing $$\frac{\partial g_{m,l}}{\partial p_{n,k}}$$

is computing $$\frac{\partial \tilde{I}_L}{\partial p_{n,k}},$$

or more generally $$\frac{\partial x}{\partial p_{n,k}}.$$

We derive a set of K*N=2N secondary partial differential vector equations whose time-sampled solutions produce the partial derivatives. To do this we take a partial derivative $$\frac{\partial}{\partial p_{n,k}}$$

that gives, as the $l^{th}$ component of the $(n,k)^{th}$ equation, $$\frac{\partial}{\partial p_{n,k}} \frac{\partial x_l}{\partial t} = \frac{\partial A_{l,l'}}{\partial x_{l''}} \frac{\partial x_{l''}}{\partial p_{n,k}} x_{l'} + [A(x)]_{l,l'} \frac{\partial x_{l'}}{\partial p_{n,k}} + T_{n,k} b_l, \tag{36}$$

where Einstein summation notation is used and (in the case $\tau = 0$), $$T_{n,k}(t) = \begin{cases} 0 & 0 \leq t \leq dt \\ \vdots & \\ \delta_{1,k} + i\delta_{2,k} & (n-1)dt \leq t \leq ndt. \\ \vdots & \\ 0 \leq t \leq Ndt \end{cases} \tag{37}$$

Denoting $$y_{n,k}(t) = \frac{\partial x}{\partial p_{n,k}}(t) \tag{38}$$

$$[A'(x)]_{l,l''} = \frac{\partial A_{l,l'}}{\partial x_{l''}} x_{l'}$$

and commuting the partial derivatives, the components of Equation 36 can be re-written as the non-linear vector PDE $$\dot{y}_{n,k} = [A'(x) + A(x)]y_{n,k} + T_{n,k}(t)b. \tag{39}$$

Therefore, once x(t) has been computed, it can be plugged into each of the DEs for $y_{n,k}$, the DEs can be solved with the initial condition $y_{n,k}((n-1)dt) = 0$ (by causality $y_{n,k} = 0$ for $t < (n-1)dt$), and the exact formula $$\frac{\partial g_{m,l}}{\partial p_{n,k}} = \frac{\partial h_l(x(t))}{\partial p_{n,k}} \bigg|_{t=t_m} \tag{40}$$

$$= \frac{\partial h_l}{\partial x_{l'}} \frac{\partial x_{l'}}{\partial p_{n,k}} \bigg|_{t=t_m}$$

$$= \frac{\partial h_l}{\partial x_{l'}} [y_{n,k}(t_m)]_{l'}$$

is produced, where $h_l$ was defined implicitly in Equation 35 and each $$\frac{\partial h_l}{\partial x_{l'}}$$

can be computed.

If we take the Taylor series of A(x) about x=0, we have $$A(x)=A_0+A_1(x)+A_2(x)+ \quad (41)$$

where each $A_p$ is a matrix polynomial in the coordinates of x with all terms having order exactly p. The $0^{th}$ order approximation of Equation 39 gives $$\dot{y}_{n,k}=A_0 y_{n,k}+T_{n,k}(t)b. \quad (42)$$

In this form, we see that $y_{n,k}$ is just the same as x where the DE for x, Equation 39, has been linearized and the forcing is the top hat $$T_{n,k}\cdot y_{n,k}=x|_{A=A_0,\alpha=T_{n,k}}.$$

In some instances, the linearization condition $A=A_0$ is approximately the same as the guarantee $\|A(x)-A_0\|=1$, which can be met by setting $\alpha=\varepsilon T_{n,k}$ with $\varepsilon$ chosen so that $$\left\|A\left(\frac{\varepsilon\|b\|}{\|A_0\|}\right)-A_0\right\| \ll 1.$$

Therefore, the zeroth order approximation to the Jacobian is $$\frac{\partial g_{m,l}}{\partial p_{n,k}} \approx \frac{g(\varepsilon e_{n,k})}{\varepsilon}, \quad (43)$$

which provides another derivation of Equation 33.

FIGS. 4A, 4B, 4C and 4D show parameters and other data for an example pulse sequence generated using a distortion operator based on the example circuit model 200. The example pulse sequence was generated based on a target operation corresponding to a π/2 rotation about the x-axis for an example spin. The pulse sequence was generated using an optimization engine that uses optimal control theory to modify an initial guess for the pulse sequence. In particular, the framework provided by the GRAPE algorithm was modifed to generate a pulse sequence for $$U=\frac{\pi}{2}\Big)_x,$$

based on the distortion operator derived from the example circuit model 200 of FIG. 2. In this example, we used the following values
L=100 pH $(1+\alpha_L|I_L|^2)$
R=0.01Ω$(1+\alpha_R|I_L|^{\eta_R})$
$R_L$=50Ω
$C_l$=2.49821 pF
$C_m$=3.58224 fF
$\alpha_L$=0.05 $A^{-2}$
$\alpha_R$=0.001 $A^{-2}$
$\eta_R$=0.7
$\omega_0$=10.0622 GHz.

Figure 4A:
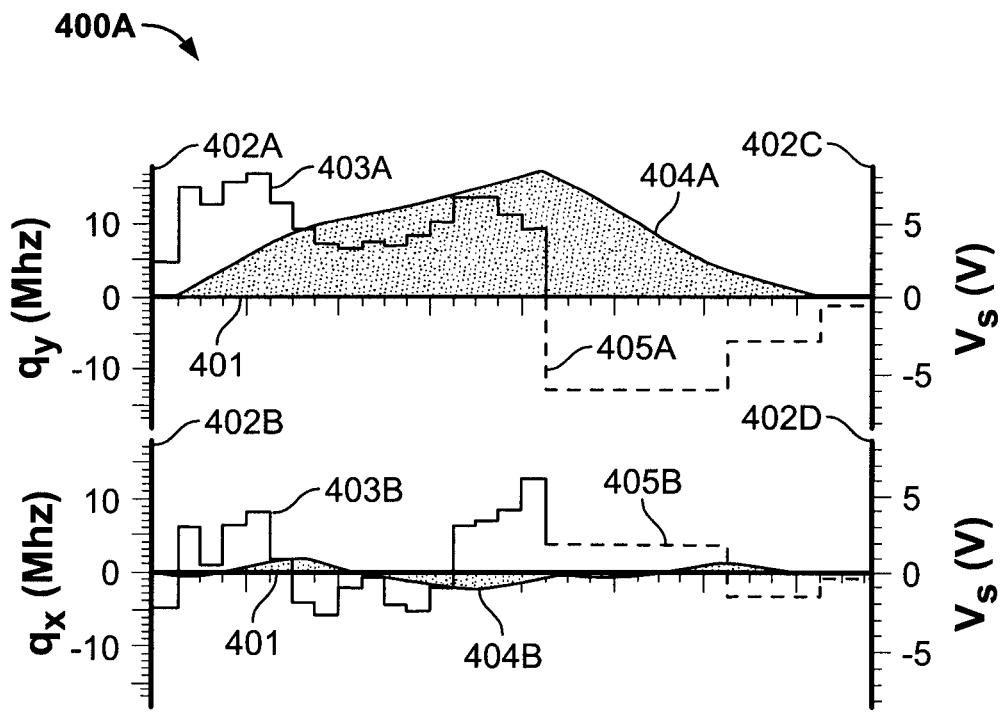
FIG. 4A shows a plot 400A of the input voltage signal and the control signal over the duration of the example pulse sequence.

FIG. 4A shows a plot 400A of the input voltage signal corresponding to the example pulse sequence, and the control signal over the duration of the example pulse sequence. The example plot 400A includes a vertical axis 402A that represents the x-component of the power of the control signal generated by the control system, and another vertical axis 402C that represents the x-component of the input voltage signal received by the control system. The example plot 400A also includes a vertical axis 402B that represents the y-component of the power of the control signal generated by the control system, and another vertical axis 402D that represents the y-component of the input voltage signal received by the control system. The horizontal axis 401 represents the time duration of the pulse sequence.

In the example shown in FIG. 4A, the y-component of the input voltage signal is represented by a first line 403A plotted against the vertical axis 402C on the right; and the x-component of the input voltage signal is represented by a second line 403B plotted against the vertical axis 402D on the right. Similarly, the y-component of the simulated control signal is represented by a third line 404A plotted against the vertical axis 402A on the left; and the x-component of the simulated control signal is represented by a fourth line 404B plotted against the vertical axis 402B on the left. As shown in FIG. 4A, the example pulse sequence includes ringdown compensation steps that are indicated by the dashed-line portions 405A, 405B of the first and second lines 403A, 403B.

In the example shown in FIG. 4A, there are 16 time steps of length 0.5 nanoseconds (ns) shown as a solid step function in the first and second lines 403A, 403B. The pulse has been made to be robust to static uncertainty in the Hamiltonian parameters δω (the frequency offset of the qubit) and γ (the gyromagnetic ratio of the qubit) and the non-linearity parameter $\alpha_L$. Since the circuit has a high quality factor in this example, it would take many times the length of the pulse for the ringdown tail to decay to zero. An active ringdown suppression scheme with three compensation steps of lengths 4 ns, 2 ns, and 1 ns is used in this example, as shown by the dashed-line portions 405A, 405B. Other types of ringdown suppression can be used.

Figure 4B:
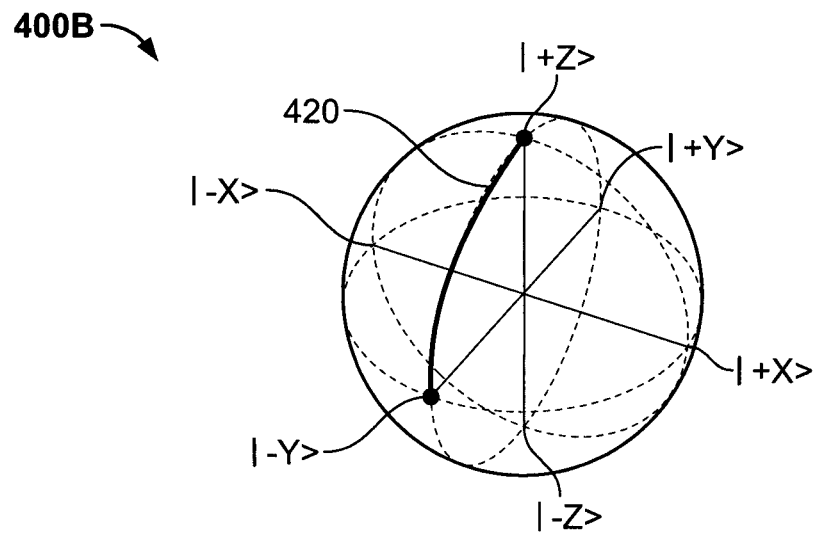
FIG. 4B shows a plot 400B of the Bloch sphere for an example spin.

FIG. 4B shows a plot 400B of the Bloch sphere for an example spin that experiences the control signal shown in FIG. 4A. The example plot 400B includes a line 420 representing the simulated trajectory of the spin state when the pulse sequence shown in FIG. 4A is applied to the spin by the resonator circuit. As shown in FIG. 4B, the spin state undergoes a π/2 rotation about the x-axis, which corresponds to the target operation that the pulse sequence was engineered to perform.

Figure 4C:
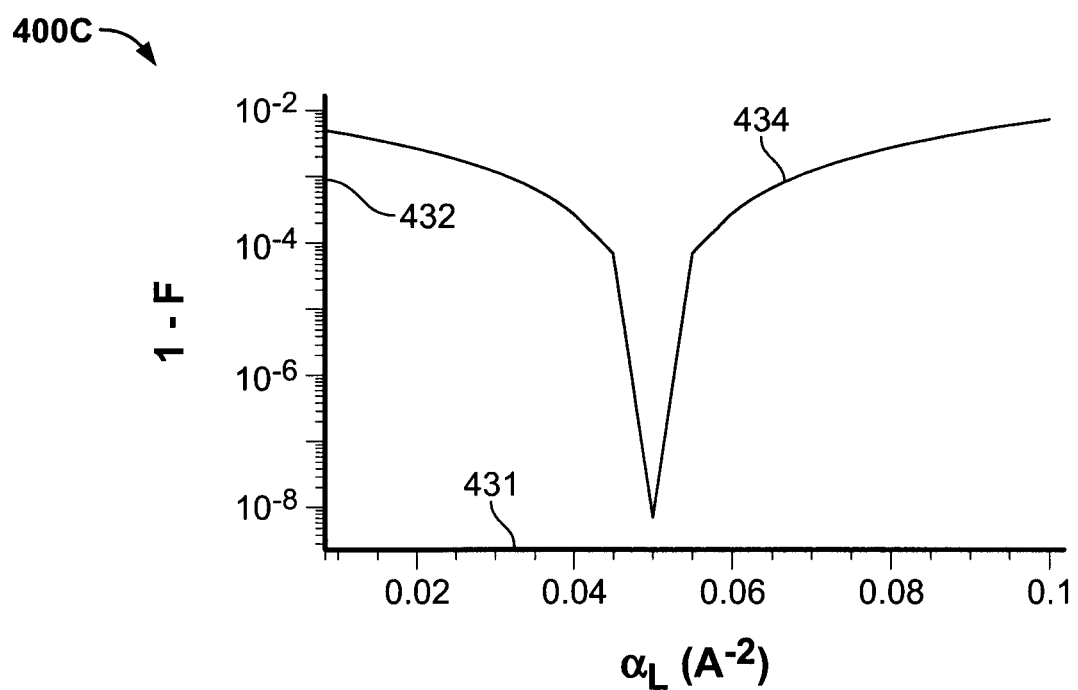
FIG. 4C shows a plot 400C of simulated fidelity for a range of values of the non-linearity constant for the inductance $\alpha_L$.

FIG. 4C shows a plot 400C of simulated fidelity for a range of values of the non-linearity constant for the inductance $\alpha_L$. The example plot 400C includes a vertical axis 432 that represents the fidelity of the simulated control signal for the target operation (a π/2 rotation about the x-axis), and a horizontal axis 431 that represents the non-linearity constant for the inductance $\alpha_L$. The fidelity is represented as 1−F, which means that the ideal value is zero. As shown by the line 434 plotted in FIG. 4C, the fidelity remains below $10^{-2}$ over the full simulated range of $\alpha_L$, and has a minimum below $10^{-8}$ at the central value of $\alpha_L$=0.05 $A^{-2}$.

Figure 4D:
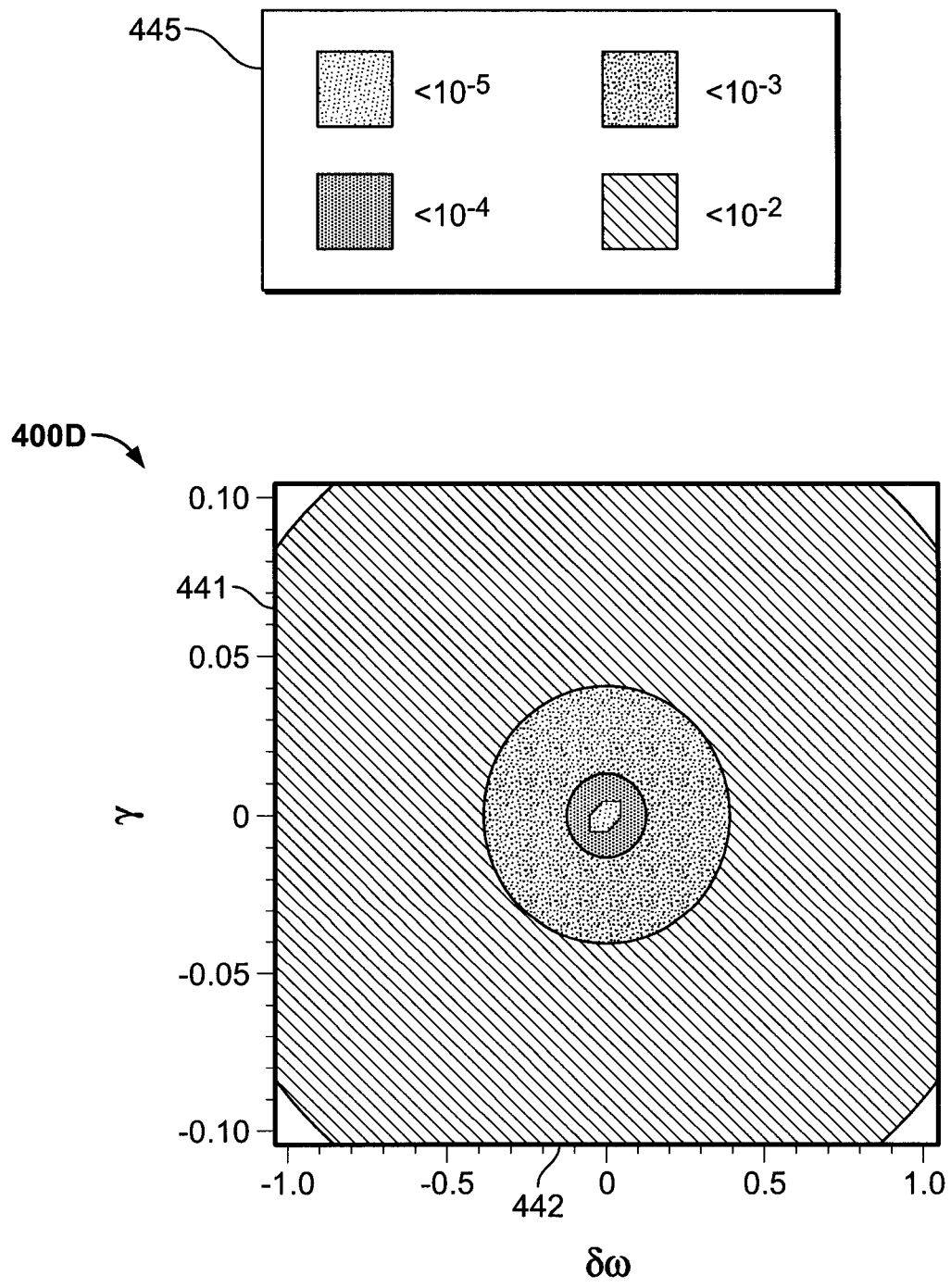
FIG. 4D shows a plot 400D of simulated fidelity for a range of values of two parameters of the spin system model.

FIG. 4D shows a plot 400D of simulated fidelity for a range of values of two parameters of the spin system model. In particular, the simulated fidelity is shown for a range of values of the gyromagnetic ratio γ and the frequency offset δω. The example plot 400D includes a vertical axis 441 that represents the simulated range of values for the gyromagnetic ratio γ, and a horizontal axis 442 that represents the simulated range of values for the frequency offset δω. Shading in the plot 400D indicates the fidelity according to the legend 445 shown in FIG. 4D. The fidelity is represented as 1−F, which means that the ideal value is zero. As shown in FIG. 4D, the fidelity remains below $10^{-2}$ over substantially the entire simulated range for both parameters, and has a minimum below $10^{-5}$ at the central value of γ=δω=0.

Having demonstrated the ability to find a robust gate in the presence of a non-linear distortion operator, we consider the effect it has on the control landscape. In the presence of a non-trivial distortion operator, finding optimal solutions could be more expensive, measured in the number of steps taken by the optimizer. Therefore, a trade-off between computational cost and gate time length could reasonably be expected. We perform a numerical study to examine this relationship in an example context.

In the numerical study, the allowed input power to the resonator used by the optimization engine was bound by 10 different voltages ranging from 1V to 10 V, where 1V is on the edge of the linear regime, and 10 V is highly non-linear. For each of these bounds, we attempt to compute a pulse having a fidelity of at least F=0.99 for a target operation corresponding to a π/2 rotation about the x-axis with 160 pulse times, and using a different random initial guess each time. The total length of the pulse was set to $$T_{pulse} = \frac{0.25}{f_{s.s.}},$$

where $f_{s.s.}$ is the steady state driving frequency of the resonator at the corresponding voltage bound. The number of time steps was held constant at N=16 for each trial. The gradient approximation from Equation 30 was used. On each trial, we count the number of times the distortion function g was called. The results are shown in FIGS. 3C and 3D where it can be seen that the number of calls actually tends to decrease as the allowed non-linearity is increased, indicating that the control landscape does not become more difficult to navigate.

Figure 3C:
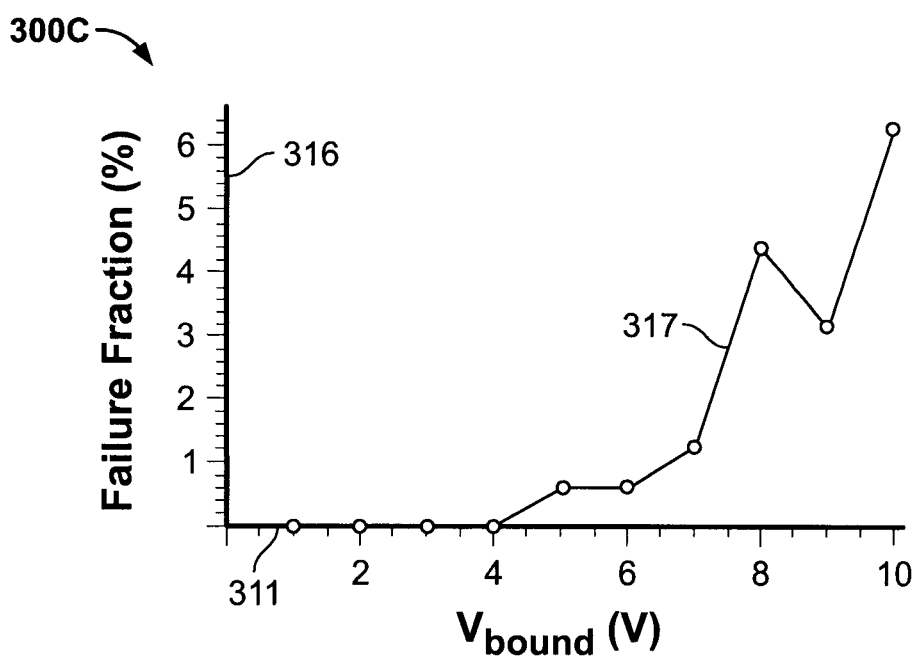
FIG. 3C shows a plot 300C of the failure fraction as a function of the voltage bound for the input voltage signal that drives the resonator circuit.

FIG. 3C shows a plot 300C of the failure fraction as a function of the voltage bound for the input voltage signal that drives the resonator circuit. The example plot 300C includes a vertical axis 316 that represents the percentage of pulses that failed to reach a quality criterion before the step size of the pulse was effectively zero. In this example, the quality criterion was a fidelity of 0.99. The horizontal axis 311 represents the voltage bound of the input voltage signal. In FIG. 3C, the discrete points on the line 317 represent the respective failure fractions for ten discrete values of the voltage bound. At each value of the voltage bound, 160 pulses were searched for, with each pulse having a total pulse length of $T_{pulse}=0.25/f_{s.s.}$, where $f_{s.s.}$ represents the corresponding steady-state frequency shown in FIG. 3B. As shown in the plot 300C in FIG. 3C, the failure fraction below a voltage bound of 5 V was effectively zero, and the failure fraction generally increased to as high as 6% from 5 V to 10 V.

Figure 3D:
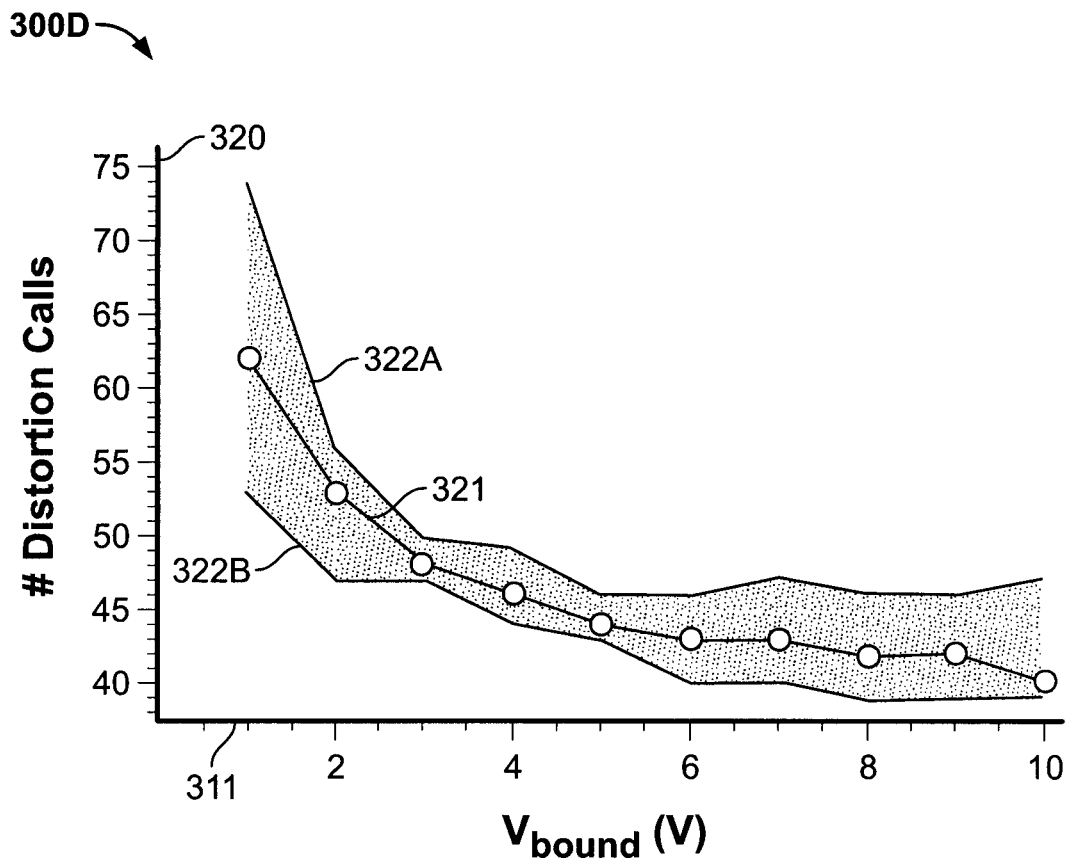
FIG. 3D shows a plot 300D of the number of distortion calls made to the distortion function to generate each of the pulses that did reach the quality criterion (fidelity=0.99).

FIG. 3D shows a plot 300D of the number of distortion calls made to the distortion function to generate each of the pulses that did reach the quality criterion (fidelity=0.99). The example plot 300D includes a vertical axis 320 that represents the number of calls made to the distortion function and the horizontal axis 311 that represents the voltage bound for the input voltage signal that drives the resonator circuit. Three lines are plotted in FIG. 3D for each of the ten discrete values of the voltage bound. A center line 321 represents the median number of calls for the pulses that reached the quality criterion at each value of the voltage bound, and an upper boundary line 322A and a lower boundary line 322B indicate the 16% and 84% quantiles of the same. As shown in the plot 300D, the number of calls to the distortion operator generally decreased as the voltage bound increased from 1 volt to 10 volts.

Figure 5:
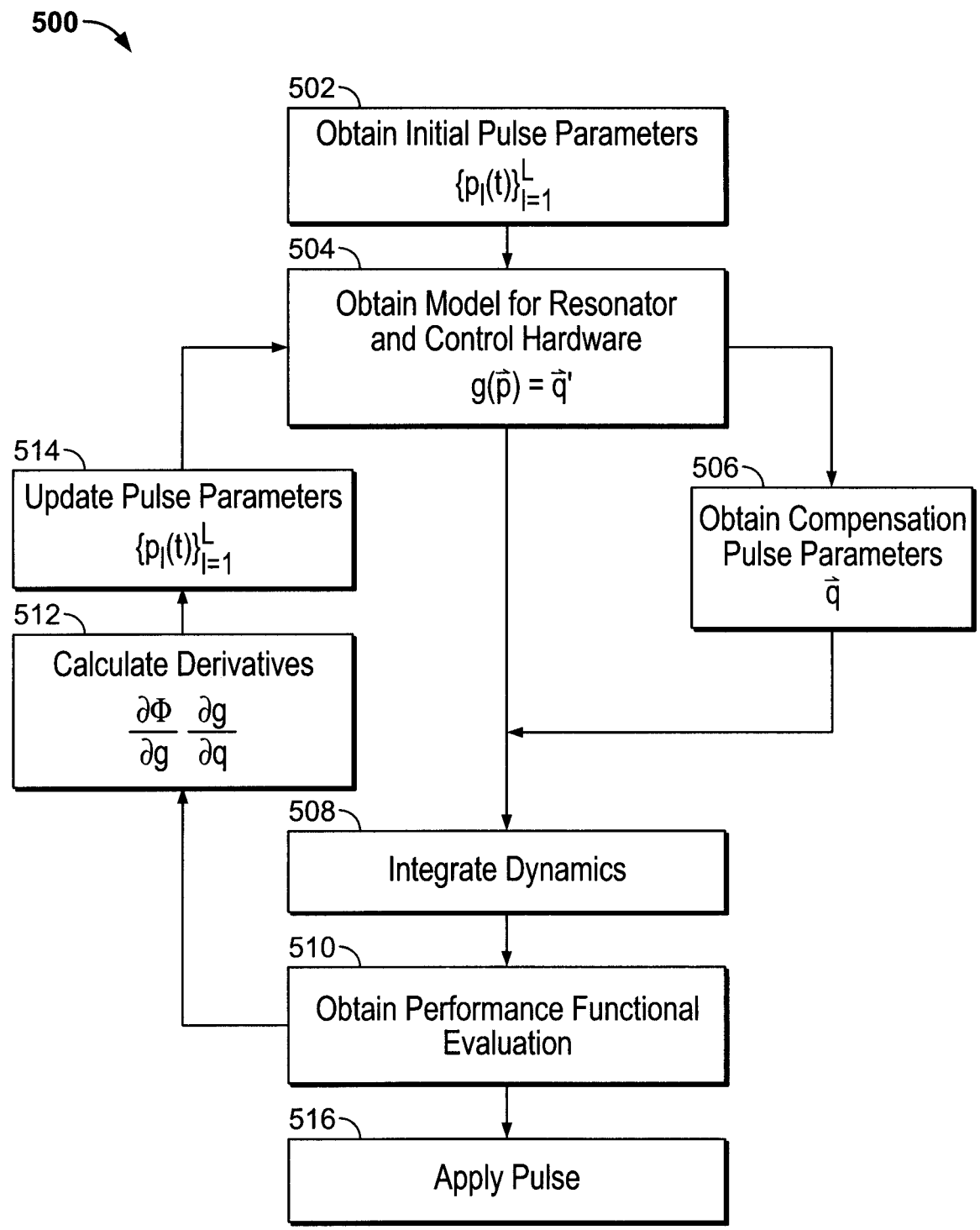
FIG. 5 is a flowchart showing an example process 500 for controlling a quantum system.

FIG. 5 is a flowchart showing an example process 500 for controlling a quantum system. In the example shown in FIG. 5, the quantum system is a spin system that includes one or more spins controlled by a resonator circuit, but the process 500 can be adapted for other types of quantum systems, which may be controlled by other types of control systems. The example process 500 may include additional or different operations, and the operations can be performed in the order shown or in another order. In some instances, one or more of the operations is repeated or iterated, for example, until a terminating condition is reached. In some instances, an operation can include one or more sub-processes, or multiple operations can be combined or performed in parallel.

At 502, initial pulse parameters are obtained. The initial pulse parameters correspond to an initial series of values for a pulse sequence. The initial set of values can be a random or other type of "guess," or the initial set of values can be based on another engineered pulse, or other factors. At 504, a distortion model for the control system is obtained. For instance, the distortion model may correspond to the resonator circuit or other control hardware in the control system. In the example shown, the distortion model includes a non-linear relationship between the input signal delivered to the control system and the output signal produced by the control system.

At 506, compensation pulse parameters are obtained. At 508, the system dynamics are integrated using the compensation pulse parameters and pulse parameters. At 510, a performance functional evaluation is obtained. At 512, derivatives are calculated based on the distortion operator and the performance functional evaluation. At 514, pulse parameters are updated based on the calculated derivatives. The operations shown in FIG. 5A can be iterated, for example, until the performance functional evaluation reaches a quality threshold or until another terminating condition is reached. For instance, the optimization operations can be iterated until the integrated dynamics indicate a fidelity above a threshold value (e.g. 99% or another threshold) based on a target operation to be applied by the pulse sequence.

At 516, the pulse sequence produced by updating the pulse parameters at 514 is applied to the spin system. For instance, the pulse sequence can be applied by delivering an input signal to the control system, causing the control system to generate a control signal that acts on the spin system. The input signal delivered to the control system can be, for example, a series of values or other data representing the series of pulse phases and amplitudes in the pulse sequence.

In conclusion, we have presented an optimization framework that permits the design of robust quantum control sequences that account for general simulatable distortions by classical control hardware. We have demonstrated that even when distortions are non-linear with respect to the input—using the particular example of a non-linear resonator circuit—robust quantum control may still be achieved, and searching through the control landscape does not necessarily become more difficult. Thus, classical control devices may be operated in their high power regime to permit fast high fidelity quantum operations, increasing the number of gates that can be performed within the decoherence time of the quantum system.

Some of the subject matter and operations described in this specification can be implemented in digital electronic circuitry, or in computer software, firmware, or hardware, including the structures disclosed in this specification and their structural equivalents, or in combinations of one or more of them. Some of the subject matter described in this specification can be implemented as one or more computer programs, i.e., one or more modules of computer program instructions, encoded on a computer storage medium for execution by, or to control the operation of, data-processing apparatus. A computer storage medium can be, or can be included in, a computer-readable storage device, a computer-readable storage substrate, a random or serial access memory array or device, or a combination of one or more of them. Moreover, while a computer storage medium is not a propagated signal, a computer storage medium can be a source or destination of computer program instructions encoded in an artificially generated propagated signal. The computer storage medium can also be, or be included in, one or more separate physical components or media (e.g., multiple CDs, disks, or other storage devices).

The term "data-processing apparatus" encompasses all kinds of apparatus, devices, and machines for processing data, including by way of example a programmable processor, a computer, a system on a chip, or multiple ones, or combinations, of the foregoing. The apparatus can include special purpose logic circuitry, e.g., an FPGA (field programmable gate array) or an ASIC (application specific integrated circuit). The apparatus can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them.

A computer program (also known as a program, software, software application, script, or code) can be written in any form of programming language, including compiled or interpreted languages, declarative or procedural languages. A computer program may, but need not, correspond to a file in a file system. A program can be stored in a portion of a file that holds other programs or data (e.g., one or more scripts stored in a markup language document), in a single file dedicated to the program, or in multiple coordinated files (e.g., files that store one or more modules, sub programs, or portions of code). A computer program can be deployed to be executed on one computer or on multiple computers that are located at one site or distributed across multiple sites and interconnected by a communication network.

Some of the processes and logic flows described in this specification can be performed by one or more programmable processors executing one or more computer programs to perform actions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and processors of any kind of digital computer. Generally, a processor will receive instructions and data from a read-only memory or a random-access memory or both. A computer can include a processor that performs actions in accordance with instructions, and one or more memory devices that store the instructions and data. A computer may also include, or be operatively coupled to receive data from or transfer data to, or both, one or more mass storage devices for storing data, e.g., magnetic disks, magneto optical disks, or optical disks. However, a computer need not have such devices. Devices suitable for storing computer program instructions and data include all forms of non-volatile memory, media and memory devices, including by way of example semiconductor memory devices (e.g., EPROM, EEPROM, flash memory devices, and others), magnetic disks (e.g., internal hard disks, removable disks, and others), magneto optical disks, and CD-ROM and DVD-ROM disks. In some cases, the processor and the memory can be supplemented by, or incorporated in, special purpose logic circuitry.

To provide for interaction with a user, operations can be implemented on a computer having a display device (e.g., a monitor, or another type of display device) for displaying information to the user and a keyboard and a pointing device (e.g., a mouse, a trackball, a tablet, a touch-sensitive screen, or another type of pointing device) by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's client device in response to requests received from the web browser.

A computer system may include a single computing device, or multiple computers that operate in proximity or generally remote from each other and typically interact through a communication network. Examples of communication networks include a local area network ("LAN") and a wide area network ("WAN"), an inter-network (e.g., the Internet), a network comprising a satellite link, and peer-to-peer networks (e.g., ad hoc peer-to-peer networks). A relationship of client and server may arise by virtue of computer programs running on the respective computers and having a client-server relationship to each other.

Some aspects of what is described above include a control method for controlling a spin system. Some aspects of what is described above include a system that includes a spin system, a control system and a computing system. In some aspects, a spin system includes spins that respond to a control signal generated by a resonator circuit in a control system. The resonator circuit is configured to generate the control signal in response to a voltage signal received by the control system. A spin system model represents the spin system and includes a control parameter representing the control signal. A distortion model represents a non-linear relationship between the control signal and the voltage signal. A target operation to be applied to one or more of the spins by operation of the resonator circuit is defined. A computing system generates a pulse sequence that includes a sequence of values for the voltage signal, based on the target operation, the spin system model and the distortion model. The resonator circuit applies the pulse sequence to the spin system.

Implementations of these and other aspects may include one or more of the following features. The resonator circuit includes a superconducting resonator device, the distortion model represents a non-linear operating regime of the superconducting resonator device, and the pulse sequence is applied to the spin system by operation of the resonator device in the non-linear operating regime. The control system includes the resonator circuit and other hardware, and the non-linear relationship represented by the distortion model accounts for non-linear effects from the resonator circuit and the other hardware. The distortion model is generated from a resonator circuit model that represents the resonator circuit. The resonator circuit model includes a system of differential equations that defines a non-linear relationship between the voltage signal and an inductance in the resonator circuit. The control parameter can be the amplitude of a magnetic field generated by the resonator circuit. The pulse sequence is generated using optimal control theory to iteratively modify the sequence of values. An uncertainty model represents uncertainty in a parameter of the resonator circuit, and the pulse sequence is generated based on the target operation, the spin system model, the distortion model and the uncertainty model. The resonator circuit can be a classical resonator circuit, and the non-linear relationship can represent a classical phenomenon. The control system comprises the resonator circuit, a mixer and an amplifier.

While this specification contains many details, these should not be construed as limitations on the scope of what may be claimed, but rather as descriptions of features specific to particular examples. Certain features that are described in this specification in the context of separate implementations can also be combined. Conversely, various features that are described in the context of a single implementation can also be implemented in multiple embodiments separately or in any suitable subcombination.

A number of embodiments have been described. Nevertheless, it will be understood that various modifications can be made. Accordingly, other embodiments are within the scope of the following claims.

What is claimed is:

1. A control method for controlling a spin system, the control method comprising:
   accessing a spin system model that represents a spin system, the spin system comprising spins that respond to a control signal generated by a resonator circuit in a control system, the spin system model comprising a control parameter representing the control signal, the resonator circuit configured to generate the control signal in response to a voltage signal received by the control system;
   accessing a distortion model that represents a non-linear relationship between the control signal and the voltage signal;
   defining a target operation to be applied to one or more of the spins by operation of the resonator circuit;
   generating, by operation of a computing system, a pulse sequence comprising a sequence of values for the voltage signal, the pulse sequence generated based on the target operation, the spin system model and the distortion model; and
   applying the pulse sequence to the spin system by operation of the resonator circuit.

2. The control method of claim 1, wherein the resonator circuit comprises a superconducting resonator device, the distortion model represents a non-linear operating regime of the superconducting resonator device, and the pulse sequence is applied to the spin system by operation of the resonator device in the non-linear operating regime.

3. The control method of claim 1, wherein the control system comprises the resonator circuit and other hardware, and the non-linear relationship represented by the distortion model accounts for non-linear effects from the resonator circuit and the other hardware.

4. The control method of claim 1, comprising generating the distortion model from a resonator circuit model that represents the resonator circuit, the resonator circuit model comprising a system of differential equations that defines a non-linear relationship between the voltage signal and an inductance in the resonator circuit.

5. The control method of claim 1, wherein the control parameter comprises an amplitude of a magnetic field generated by the resonator circuit.

6. The control method of claim 1, wherein generating the pulse sequence comprises using optimal control theory to iteratively modify the sequence of values.

7. The control method of claim 1, further comprising accessing an uncertainty model representing uncertainty in a parameter of the resonator circuit, wherein the pulse sequence is generated based on the target operation, the spin system model, the distortion model and the uncertainty model.

8. The control method of claim 1, wherein the resonator circuit comprises a classical resonator circuit and the non-linear relationship represents a classical phenomenon.

9. A system comprising:
   a spin system comprising spins that respond to a control signal generated by a resonator circuit;
   a control system comprising the resonator circuit and configured to receive a voltage signal, the resonator circuit configured to generate the control signal in response to receiving the voltage signal;
   a computing system comprising one or more processors configured to perform operations comprising:
      accessing a spin system model that represents the spin system, the spin system model comprising a control parameter representing the control signal;
      accessing a distortion model representing a non-linear relationship between the control signal and the voltage signal;
      defining a target operation to be applied to one or more of the spins by operation of the resonator circuit; and
      generating a pulse sequence comprising a sequence of values for the voltage signal, the pulse sequence generated based on the target operation, the spin system model and the distortion model.

10. The system of claim 9, wherein the resonator circuit comprises a superconducting resonator device, the distortion model represents a non-linear operating regime of the superconducting resonator device, and the pulse sequence is configured to operate the resonator device in the non-linear operating regime.

11. The system of claim 9, wherein the control system comprises the resonator circuit, a mixer and an amplifier.

12. The system of claim 9, the operations comprising generating the distortion model from a resonator circuit model that represents the resonator circuit, the resonator circuit model comprising a system of differential equations that defines a non-linear relationship between the voltage signal and an inductance in the resonator circuit.

13. The system of claim 9, wherein the resonator circuit comprises a classical resonator circuit and the non-linear relationship represents a classical phenomenon.

14. The system of claim 9, wherein generating the pulse sequence comprises using optimal control theory to iteratively modify the sequence of values.

15. A control method for controlling a quantum system, the control method comprising:
   accessing a quantum system model representing a quantum system, the quantum system comprising qubits that respond to a control signal generated by a control system, the quantum system model comprising a control parameter representing the control signal, the control system configured to generate the control signal in response to an input signal received by the control system;

accessing a distortion model representing a non-linear relationship between the control signal and the input signal;

defining a target operation to be applied to one or more of the qubits by operation of the control system;

generating a control sequence comprising a sequence of values for the input signal, the control sequence based on the target operation, the quantum system model and the distortion model; and applying the control sequence to the quantum system by operation of the control system.

16. The control method of claim 15, comprising combining the target operation, the quantum system model and a distortion operator in an optimization engine to generate the control sequence.

17. The control method of claim 15, wherein the quantum system comprises a spin system, the control system comprises a resonator device, the control parameter comprises an amplitude of a magnetic field generated by the resonator device, the input signal comprises a voltage signal received by the control system, and the distortion model represents a non-linear relationship between an amplitude of the magnetic field and the voltage signal received by the control system.

18. The control method of claim 15, wherein generating the control sequence comprises using optimal control theory to iteratively modify the sequence of values.

19. The control method of claim 15, further comprising accessing an uncertainty model representing uncertainty in a parameter of the control system, wherein the pulse sequence is generated based on the target operation, the quantum system model, the distortion model and the uncertainty model.

20. The control method of claim 15, wherein the control system comprises classical control hardware, and the non-linear relationship represents a classical phenomenon.

21. The control method of claim 1, wherein the non-linear relationship represented by the distortion model accounts for a non-linear kinetic inductance of the resonator circuit.

* * * * *

UNITED STATES PATENT AND TRADEMARK OFFICE
CERTIFICATE OF CORRECTION

| | | |
|---|---|---|
| PATENT NO. | : 10,587,277 B2 | Page 1 of 1 |
| APPLICATION NO. | : 15/328951 | |
| DATED | : March 10, 2020 | |
| INVENTOR(S) | : Hincks et al. | |

It is certified that error appears in the above-identified patent and that said Letters Patent is hereby corrected as shown below:

On the Title Page

Page 3, Column 2, Line 38, delete "manipulaion" and insert -- manipulation -- therefor.

In the Specification

Column 6, Line 40, delete "$\otimes R^K \rightarrow R^M \otimes R^L$" and insert -- $\otimes R^K \rightarrow R^M \otimes R^L$ -- therefor.

Column 8, Line 61, delete "h:$R^m \rightarrow R^K$," and insert -- h:$R^M \rightarrow R^K$, -- therefor.

Column 9, Line 35, delete "a" and insert -- α -- therefor.

Column 9, Line 57, delete "a" and insert -- α -- therefor.

Column 14, Line 18, delete "$\vec{x}(t) = e^{-i\omega_0 t}\vec{y}(t).$" and insert -- $\vec{x}(t) = e^{-i\omega_0 t}\vec{y}(t).$ -- therefor.

Column 14, Line 32, delete "$\tilde{I}_L(t) = e^{-i\omega_0 t} I_L(t),$" and insert -- $\tilde{I}_L(t) = e^{-i\omega_0 t} I_L(t),$ -- therefor.

Column 16, Line 23, delete "τ=0)," and insert -- $\tau_1$=0), -- therefor.

Signed and Sealed this
Seventh Day of July, 2020

Andrei Iancu
*Director of the United States Patent and Trademark Office*